(12) United States Patent
Eom et al.

(10) Patent No.: US 11,862,234 B2
(45) Date of Patent: *Jan. 2, 2024

(54) MEMORY DEVICE AND OPERATION METHOD THEREOF

(71) Applicant: SAMSUNG ELECTRONICS CO., LTD., Suwon-si (KR)

(72) Inventors: Yoon-Joo Eom, Hwaseong-si (KR); Seungjun Bae, Hwaseong-si (KR); Hye Jung Kwon, Seoul (KR); Young-Ju Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 176 days.

This patent is subject to a terminal disclaimer.

(21) Appl. No.: 17/457,077

(22) Filed: Dec. 1, 2021

(65) Prior Publication Data

US 2022/0093161 A1 Mar. 24, 2022

Related U.S. Application Data

(63) Continuation of application No. 16/136,895, filed on Sep. 20, 2018, now Pat. No. 11,195,571.

(30) Foreign Application Priority Data

Nov. 28, 2017 (KR) .......................... 10-2017-0159995

(51) Int. Cl.
*G11C 7/20* (2006.01)
*G11C 11/4093* (2006.01)
(Continued)

(52) U.S. Cl.
CPC .......... *G11C 11/4093* (2013.01); *G11C 5/147* (2013.01); *G11C 7/02* (2013.01);
(Continued)

(58) Field of Classification Search
CPC ....... G11C 11/4093; G11C 5/147; G11C 7/02; G11C 7/1069; G11C 7/14; G11C 7/20;
(Continued)

(56) References Cited

U.S. PATENT DOCUMENTS 5,933,459 A 8/1999 Saunders et al.
6,262,602 B1 7/2001 Draving
(Continued)

FOREIGN PATENT DOCUMENTS

CN 104835801 A * 8/2015 ............. G11C 17/16
EP 2654208 A2 * 10/2013 .......... H03M 1/0641
(Continued)

OTHER PUBLICATIONS

Jaisimha, Shruthi, Scalable Multi-Bit Precision Compute-in-Memory on Embedded-DRAM, 2021, University of Illinois at Chicago, All pages. (Year: 2021).*

(Continued)

*Primary Examiner* — Michael T Tran
(74) *Attorney, Agent, or Firm* — F. CHAU & ASSOCIATES, LLC

(57) ABSTRACT

A memory device may include a first data line driver circuit that generates a first reference voltage set based on a first code and a second code associated with a first data line, and determines bit values of the first input data received through the first data line, based on the first reference voltage set. A second data line driver circuit may similarly generate a second reference voltage set. The reference voltages may have levels based on a decision feedback equalization (DFE) technique to reduce bit errors otherwise caused by inter symbol interference.

20 Claims, 15 Drawing Sheets

(51) Int. Cl.
| | |
|---|---|
| *G11C 11/4091* | (2006.01) |
| *G11C 11/4074* | (2006.01) |
| *G11C 11/408* | (2006.01) |
| *G11C 11/4076* | (2006.01) |
| *G11C 11/4096* | (2006.01) |
| *G11C 7/14* | (2006.01) |
| *G11C 7/02* | (2006.01) |
| *G11C 29/50* | (2006.01) |
| *G11C 11/4072* | (2006.01) |
| *G11C 29/02* | (2006.01) |
| *G11C 7/10* | (2006.01) |
| *G11C 5/14* | (2006.01) |

(52) U.S. Cl.
CPC .............. *G11C 7/1069* (2013.01); *G11C 7/14* (2013.01); *G11C 7/20* (2013.01); *G11C 11/4072* (2013.01); *G11C 11/4074* (2013.01); *G11C 11/4076* (2013.01); *G11C 11/4087* (2013.01); *G11C 11/4091* (2013.01); *G11C 11/4096* (2013.01); *G11C 29/028* (2013.01); *G11C 29/50* (2013.01); *G11C 29/021* (2013.01); *G11C 29/023* (2013.01); *G11C 2207/2254* (2013.01)

(58) Field of Classification Search
CPC ............ G11C 11/4072; G11C 11/4074; G11C 11/4076; G11C 11/4087; G11C 11/4091; G11C 11/4096; G11C 29/028; G11C 29/50; G11C 29/021; G11C 29/023; G11C 2207/2254; G11C 7/1048; G11C 7/1051
USPC .............................................. 365/189.17, 226
See application file for complete search history.

(56) References Cited

U.S. PATENT DOCUMENTS

| | | | |
|---|---|---|---|
| 7,911,857 B1 | 3/2011 | Venkataraman et al. | |
| 8,019,907 B2 | 9/2011 | Talbot | |
| 8,391,347 B2 | 3/2013 | Kim et al. | |
| 9,280,454 B1 | 3/2016 | Elsasser et al. | |
| 9,294,317 B1* | 3/2016 | Wilson | H04L 25/03878 |
| 9,378,787 B2 | 6/2016 | Perego et al. | |
| 9,454,420 B1* | 9/2016 | Tai | G06F 11/073 |
| 9,542,991 B1 | 1/2017 | Xie et al. | |
| 9,749,162 B1* | 8/2017 | Mobin | H04L 25/03057 |
| 9,973,355 B1* | 5/2018 | Cartina | H04L 25/03057 |
| 2003/0020490 A1 | 1/2003 | Marshall et al. | |
| 2004/0076228 A1* | 4/2004 | Park | H04L 25/03878 375/233 |
| 2007/0171967 A1* | 7/2007 | Bae | H04L 25/03057 375/348 |
| 2007/0205926 A1 | 9/2007 | Kobayashi | |
| 2008/0089155 A1* | 4/2008 | Bae | G11C 7/1078 365/205 |
| 2009/0010320 A1 | 1/2009 | Hollis | |
| 2009/0175328 A1 | 7/2009 | Kim et al. | |
| 2011/0141827 A1 | 6/2011 | Mozak et al. | |
| 2012/0063242 A1 | 3/2012 | Kim et al. | |
| 2013/0311717 A1 | 11/2013 | Kim et al. | |
| 2013/0342240 A1* | 12/2013 | Amirkhany | H03K 5/24 327/50 |
| 2014/0368238 A1 | 12/2014 | Song | |
| 2015/0098263 A1* | 4/2015 | Hirayama | G11C 11/2275 365/145 |
| 2015/0121018 A1 | 4/2015 | Lee | |
| 2015/0286593 A1 | 10/2015 | Gans et al. | |
| 2016/0116926 A1 | 4/2016 | Kim | |
| 2016/0218619 A1 | 7/2016 | Lym | |
| 2016/0365135 A1 | 12/2016 | Gopalan et al. | |
| 2017/0092338 A1 | 3/2017 | Jung | |
| 2017/0147234 A1 | 5/2017 | Frans et al. | |
| 2017/0192913 A1 | 7/2017 | Hsu et al. | |
| 2017/0287535 A1 | 10/2017 | Lee et al. | |
| 2018/0315461 A1 | 11/2018 | Lee et al. | |
| 2019/0164594 A1 | 5/2019 | Eom et al. | |

FOREIGN PATENT DOCUMENTS

| | | | | |
|---|---|---|---|---|
| EP | 2779551 A2 | * | 9/2014 | ....... H04L 25/03343 |
| JP | 2000-304833 | | 11/2000 | |
| JP | 2003-078396 | | 3/2003 | |
| JP | 2004086488 A | * | 3/2004 | |
| JP | 2007-235623 | | 9/2007 | |
| JP | 2009-011064 | | 1/2009 | |
| JP | 2009-110643 | | 5/2009 | |
| KR | 10-0902056 | | 6/2009 | |
| KR | 1020160092205 | | 8/2016 | |
| KR | 10-2017-0112272 | | 10/2017 | |
| WO | WO-2011133333 A2 | * | 10/2011 | ....... H04L 25/03057 |
| WO | WO-2012103106 A1 | * | 8/2012 | ......... H01L 27/0251 |
| WO | WO-2014209326 A1 | * | 12/2014 | ....... H04L 25/03057 |
| WO | WO-2017019495 A1 | * | 2/2017 | .............. G06F 3/05 |
| WO | 2002021782 | | 3/2022 | |

OTHER PUBLICATIONS

Hyung-Joon Chi, et al., "A Single-Loop SS-LMS Algorithm With Single-Ended Integrating DFE Receiver for Multi-Drop DRAM Interface", IEEE Xplore Digital Library, IEEE-SA, IEEE Spectrum (Abstract nly).

JEDEC Solid State Technology Association, "Graphics Double Data Rate (GDDR6) SGRAM Standard", Jul. 2017, 190 pages.

* cited by examiner

MEMORY DEVICE AND OPERATION METHOD THEREOF

CROSS-REFERENCE TO RELATED APPLICATIONS

This application is a continuation under 35 U.S.C. § 120 of U.S. patent application Ser. No. 16/136,895, filed Sep. 20, 2018, which claims priority under 35 U.S.C. § 119 to Korean Patent Application No. 10-2017-0159995 filed on Nov. 28, 2017, in the Korean Intellectual Property Office, the disclosures of which are incorporated by reference herein in their entireties.

BACKGROUND

Embodiments of the inventive concept disclosed herein relate generally to a semiconductor memory, and more particularly, to reducing data errors in a semiconductor memory accessed through a serial data interface.

Semiconductor memory devices are classified into volatile memory devices, which do not retain data stored therein at power-off, such as static random access memory (SRAM), dynamic RAM (DRAM), synchronous DRAM (SDRAM), and the like, and nonvolatile memory devices, which retain data stored therein even at power-off. Examples of the latter type include read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM), and the like.

A DRAM device exchanges data with an external device (e.g., a host, a memory controller, or the like) through data lines (DQ). Since physical characteristics of the data lines may differ among data lines, signal characteristics of the data lines may vary. This may cause a reduction in reliability of the DRAM device.

SUMMARY

Embodiments of the inventive concept provide a memory device that may have improved reliability and afford a reduction in bit errors when exchanging data with another device.

According to an exemplary embodiment, an operation method of a memory device configured to receive data from an external device through a plurality of data lines is provided. The method may involve generating a first internal code based on a first code and a second code, where the first code includes information of a first reference voltage associated with a first data line of the plurality of data lines and the second code includes information about a decision feedback equalization (DFE) level associated with the first data line. A second internal code may be generated based on third and fourth codes, where the third code includes information of a second reference voltage associated with a second data line of the plurality of data lines and the fourth code includes information about a second decision feedback equalization (DFE) level associated with the second data line. First and second reference voltage sets may be generated based on the first and second internal codes, respectively. First input data applied on the first data line may be sampled based on the first reference voltage set, and second input data applied on the second data line may be sampled based on the second reference voltage set.

According to an exemplary embodiment, a memory device includes a plurality of memory cells, and a data line driving circuit that generates a first reference voltage set based on a first code and a second code, determines first input data input through a first data line, based on the first reference voltage set, generates a second reference voltage set based on a third code and a fourth code, and determines second input data input through a second data line, based on the second reference voltage set.

According to an exemplary embodiment, a memory system includes a plurality of memory devices, each including a memory cell array and a data line driver unit configured to drive the memory cell array and receive first input data via a respective first data line and receive second input data via a respective second data line. Each data line driver unit may include a first data line driver circuit configured to generate a first reference voltage set based on a first code and a second code associated with the first data line, and to determine bit values of the first input data received through the first data line, based on the first reference voltage set. Each data line driver may further include a second data line driver circuit configured to generate a second reference voltage set based on third and fourth codes associated with the second data line and to determine bit values of the second input data received through the second data line, based on the second reference voltage set.

BRIEF DESCRIPTION OF THE DRAWINGS

The above and other aspects and features of the inventive concept will become apparent by describing in detail exemplary embodiments thereof with reference to the accompanying drawings.

DETAILED DESCRIPTION

Figure 1:
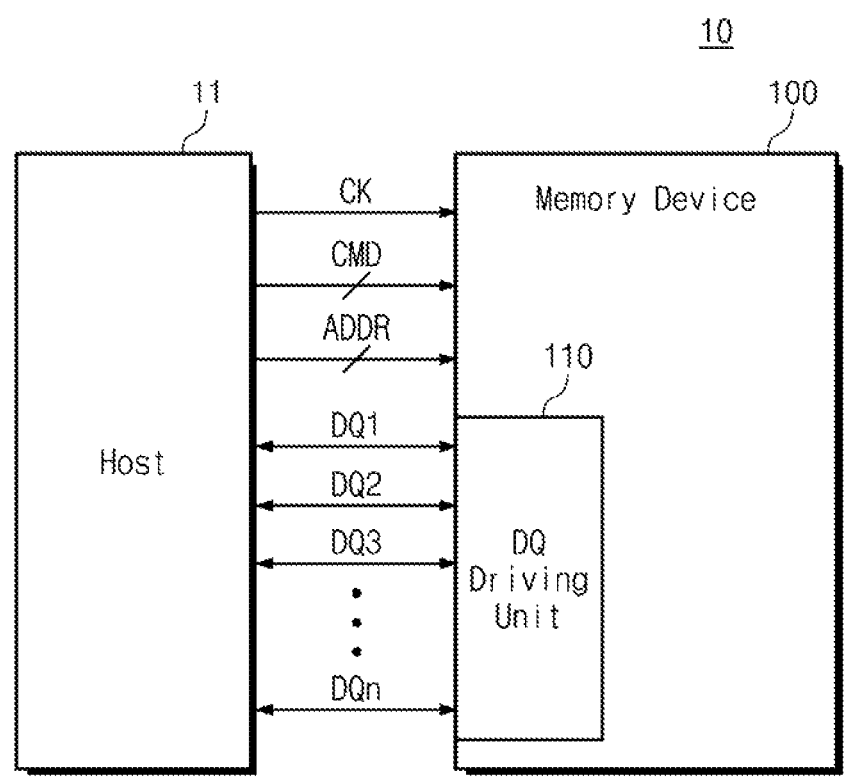
FIG. 1 is a block diagram illustrating a memory system according to an embodiment of the inventive concept.

Example embodiments of the inventive concept will now be described more fully with reference to the accompanying drawings, in which like reference numerals may refer to like elements. The inventive concept may, however, be embodied in many different forms, and is not to be construed as limited to the example embodiments set forth herein.

An element which performs a specific function or includes a specific function, described herein with such terms as "block", "unit", "module", "driver", or the like, is implemented with hardware circuitry. The hardware may be dedicated hardware for the specific function or may be general purpose hardware that executes software instructions to carry out the specific function.

In the description below, phrases such as "determine data", "determine a data signal", "recover a data signal" or the like refer to determining values of individual symbols (e.g. bit values "1" or "0") of a data signal containing a stream of symbols. The symbols may be synchronized with a clock and the values they represent may be determined by periodically sampling the data signal at the timing of the clock.

FIG. 1 is a block diagram illustrating a memory system 10 according to an embodiment of the inventive concept. Memory system 10 may include a host 11 and a memory device 100. To store data in the memory device 100 or to read data stored in the memory device 100, the host 11 may transmit a clock signal CK, a command CMD, and an address ADDR to the memory device 100. The host 11 may exchange data with the memory device 100 through a plurality of data lines DQ1 to DQn. In an example embodiment, the host 11 may be a memory controller or a central processing unit (CPU).

In an example embodiment, the host 11 may communicate with the memory device 100 based on a double data rate (DDR) interface or other suitable interface. For example, the host 11 may communicate with the memory device 100 through at least one of various communication interfaces such as a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, a Firewire interface, a universal flash storage (UFS) interface, and a nonvolatile memory express (NVMe) interface.

Under control of the host 11, the memory device 100 may store data received through the plurality of data lines DQ1 to DQn or may transmit data stored therein to the host 11 through the plurality of data lines DQ1 to DQn. In an example embodiment, the memory device 100 may include a dynamic random access memory (DRAM). In other cases, the memory device 100 may include at least one of various memory devices such as a static random access memory (SRAM), a synchronous DRAM (SDRAM), a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

In an example embodiment, the memory device 100 may include a data line driving unit 110 (hereinafter referred to as a "DQ driving unit") that is configured to control the plurality of data lines DQ1 to DQn, individually. The DQ driving unit 110 may generate a reference voltage and/or a set of reference voltages (hereinafter referred to as a "reference voltage set") for reading data provided through each of the plurality of data lines DQ1 to DQn. For example, the DQ driving unit 110 may determine whether a data signal provided through a first data line DQ1 is, at a particular sampling point, a "data 1" or "data 0" (bit value of 1 or bit value of 0), based on a comparison of the data signal voltage with the reference voltage at the sampling point. The data signal may change or maintain the previous bit value to provide binary information with every cycle of a clock, and the data signal may be sampled a short time after a rising and/or falling edge of the clock to determine a current bit value. When the data signal voltage is higher than the reference voltage, a "1" may be detected; and when the data signal voltage is below the reference voltage, a "0" may be detected. In other embodiments, the inventive concept may be utilized for detecting values of different types of symbols (non-binary symbols).

A set of reference voltages may be used to determine bit values of a data signal on any of the data lines DQ1-DQn as follows: A set of reference voltages for a given data line DQi may be comprised of an "upper reference voltage" and a "lower reference voltage" concurrently provided. The upper reference voltage may be set slightly higher than a "main reference voltage" that has been established for that data line DQi. (Hereafter, the main reference voltage for a given data line may be referred to as just the "reference voltage" for that data line.) The lower reference voltage may be set slightly lower than the main reference voltage. At any given sampling point to determine a bit value of the data signal, the signal voltage may be compared to either the upper reference voltage or the lower reference voltage. For any given sampling point, a selection of whether to use the upper reference voltage or the lower reference voltage may be made, where the selection may be based upon the bit value of the bit measured in the immediately previous clock cycle. In this manner, a filtering of the data stream is accomplished in which bit errors due to a phenomenon of Inter Symbol Interference (ISI) may be alleviated. As described below, the amount by which the upper reference voltage and the lower reference voltage each differ from the main reference voltage may be equal to a decision feedback equalization (DFE) level which has been established for that data line. A training process may be used to optimally set each of the main reference voltage and the DFE level for each data line.

In other cases, different types of noise reduction techniques and algorithms may use a set of adjusted reference voltages (e.g. upper and lower reference voltages) determined in other ways. Two or more adjusted reference voltages may be concurrently provided in a set, where one of the adjusted voltages is selected for each symbol of a data signal. The selection may be decided every clock cycle, or every N clock cycles, depending on the type and implementation of the particular noise reduction/bit error reduction approach.

In some embodiments, a noise reduction technique may be dynamically implemented. In the discussion below, phrases such as "using a reference voltage or reference voltage set" may refer to such dynamic implementation of the noise reduction scheme.

In an example embodiment, the reference voltage generated by the DQ driving unit 110 may be differently generated with respect to each of the plurality of data lines DQ1 to DQn. For example, the DQ driving unit 110 may determine bit values of a data signal provided through the first data line DQ1 by using a first reference voltage or a first reference voltage set and may determine a data signal provided through the second data line DQ2 by using a second reference voltage different from the first reference voltage (or a second reference voltage set different from the first reference voltage set). That is, the DQ driving unit 110 may determine data signals of the plurality of data lines DQ1 to DQn, based on different reference voltages or different reference voltage sets.

In an example embodiment, information of a reference voltage associated with each of the plurality of data lines DQ1 to DQn may be stored in a separate storage circuit (e.g., a mode register) in the form of a code. As one example, the inventive concept may be applied to a serial data communication system compliant with the GDDR6 standard (JEDEC standard 250, i.e., GDDR standard, version 6), in which case the reference voltage may be stored in mode register MR6 and/or MR9, which are mode registers standardized for storing reference voltages and DFE voltages. (Various codes in mode register MR6 may each represent a reference voltage as a percentage of a supply voltage VDDQ. Various codes in mode register MR9 may each represent a DFE level as a percentage of the supply voltage VDDQ.) The DQ driving unit 110 may generate an internal code, based on the above-described code and may generate a reference voltage or a reference voltage set, based on the generated internal code. Codes associated with reference voltages of the plurality of data lines DQ1 to DQn may be determined in the training process for the memory device 100. Examples of training processes are also disclosed in the GDDR6 standard.

As described above, the memory device 100 according to the inventive concept may generate different reference voltages and/or different reference voltage sets with respect to each of the plurality of data lines DQ1 to DQn and may determine data signals received through the plurality of data lines DQ1 to DQn, based on the generated reference voltages and/or reference voltage sets.

Figure 2:
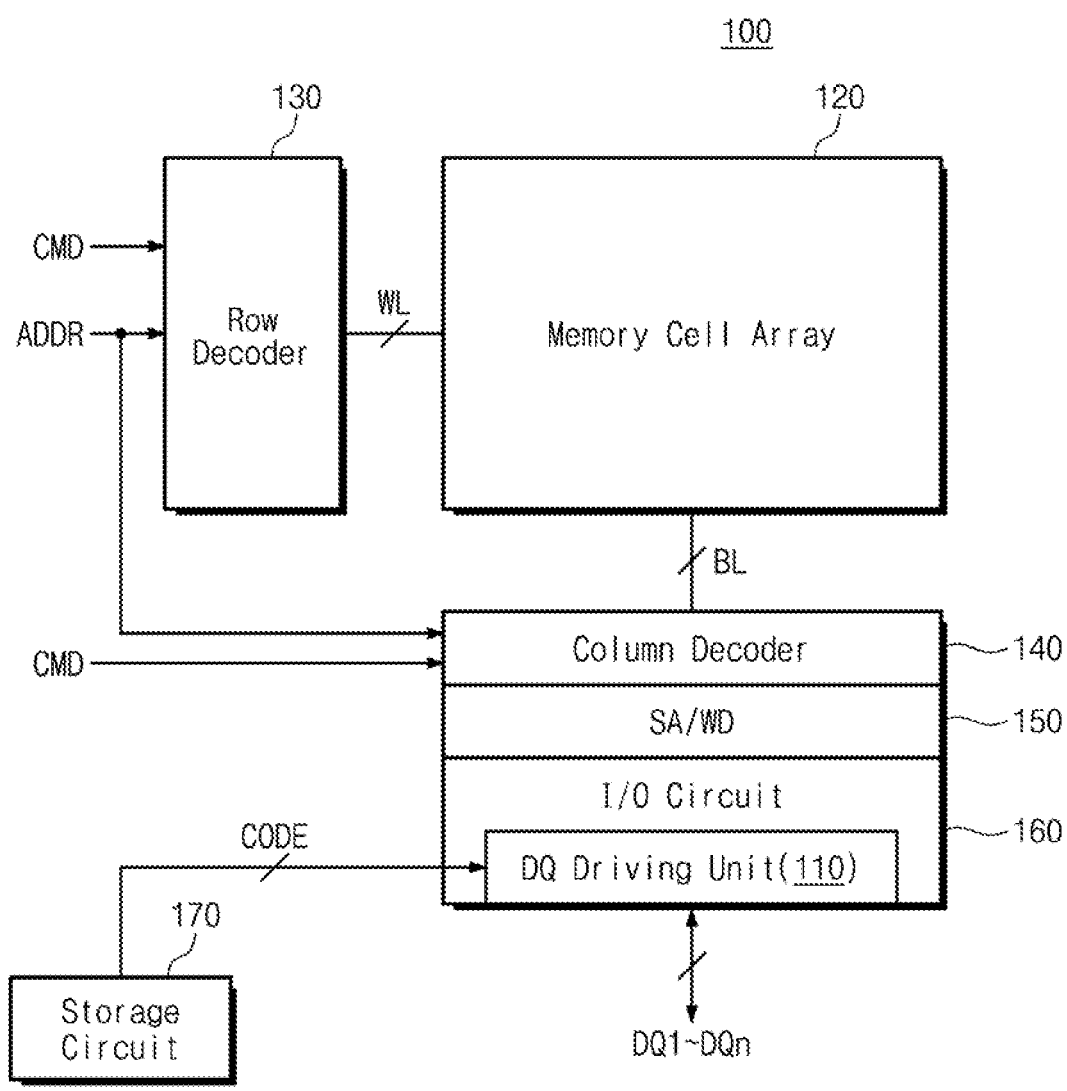
FIG. 2 is a block diagram illustrating an example memory device of FIG. 1.

FIG. 2 is a block diagram illustrating an example of the memory device 100 of FIG. 1. Referring to FIGS. 1 and 2, the memory device 100 may include a memory cell array 120, a row decoder 130, a column decoder 140, a sense amplifier/write driver 150, an input/output circuit 160, and a storage circuit 170.

The memory cell array 120 may include a plurality of memory cells. The memory cells may be connected with word lines WL and bit lines BL. Each of the memory cells may be configured to store data by controlling the word lines WL and the bit lines BL. Each of the memory cells may be a DRAM cell that includes a storage capacitor and a "transmission transistor" (interface transistor).

The row decoder 130 may be connected with the memory cell array 120 through the word lines WL. The row decoder 130 may control voltages of the word lines WL in response to an address ADDR and a command CMD. In an example embodiment, the address ADDR may be a row address, and the command CMD may be a row address strobe (RAS) signal.

The column decoder 140 may be connected with the memory cell array 120 through the bit lines BL. The column decoder 140 may receive the address ADDR and the command CMD and may select at least one bit line of the bit lines BL in response to the received signals. In an example embodiment, the address ADDR may be a column address, and the command CMD may be a column address strobe (CAS) signal. The sense amplifier/write driver 150 may sense or control a voltage of the bit line selected by the column decoder 140.

The input/output circuit 160 may be connected with the plurality of data lines DQ1 to DQn and may exchange data with an external device (e.g., the host 11) through the plurality of data lines DQ1 to DQn.

In an example embodiment, the input/output circuit 160 may include the DQ driving unit 110. As described with reference to FIG. 1, the DQ driving unit 110 may control voltages of the plurality of data lines DQ1 to DQn for the purpose of transmitting data to an external device (e.g., the host 11) through the plurality of data lines DQ1 to DQn. DQ driving unit 110 may also determine data signals received through the plurality of data lines DQ1 to DQn.

In an example embodiment, the DQ driving unit 110 may perform the above-described data determination operation on the plurality of data lines DQ1 to DQn, based on different reference voltages or different reference voltage sets. For example, the DQ driving unit 110 may receive a code "CODE" (hereafter, just "the CODE") associated with each of the plurality of data lines DQ1 to DQn from the storage circuit 170. The DQ driving unit 110 may generate a different reference voltage set with respect to each of the plurality of data lines DQ1 to DQn, based on the CODE and may determine data signals received through the plurality of data lines DQ1 to DQn, based on the generated reference voltages sets.

In an example embodiment, the CODE may include information about a reference voltage and a decision feedback equalization (DFE) level of each of the plurality of data lines DQ1 to DQn, and the DQ driving unit 110 may generate an internal code, based on the CODE associated with each of the plurality of data lines DQ1 to DQn. The internal code may be used for the DQ driving unit 110 to operate.

The storage circuit 170 may store various information needed for the memory device 100 to operate. In one example, storage circuit 170 may be embodied as one or more mode registers (MR). The CODE, which is a part of the above-described various information, may be information stored within the above-discussed sixth mode register MR6 and/or ninth mode register MR9 in a memory device compliant with the GDDR6 standard. For example, the CODE may include information about a reference voltage or a decision feedback equalization (DFE) level of each of the plurality of data lines DQ1 to DQn. In an example embodiment, the DFE level may be an offset voltage for adjusting a reference voltage to be used in a current data determination operation or for compensating a current data signal to be determined, based on a data bit previously determined.

In a GDDR6 compliant embodiment, storage circuit 170 may include mode registers MR6 and MR9, and seventh to eleventh opcodes stored in the sixth mode register MR6 may respectively indicate the plurality of data lines DQ1 to DQn, and 0-th to sixth opcodes may respectively indicate levels of corresponding reference voltages. Further, seventh to eleventh opcodes of the ninth mode register MR9 of storage circuit 170 may respectively indicate the plurality of data lines DQ1 to DQn, and 0-th to third opcodes may respectively indicate corresponding DFE levels. The above-described information (i.e., the information within the sixth and ninth mode registers MR6 and MR9) may be decided through a training operation of the memory device 100 and may be stored in the storage circuit 170 through a mode register set operation. In an example embodiment, the DQ driving unit 110 may generate the internal code, based on the above-described mode register values MR6 and MR9.

Other embodiments providing storage of the CODE may be intended for different types of memory devices (which may not be compliant with GDDR6). The CODE may be alternatively stored in different mode registers, in a vendor-specific area of a mode register, or in a separate storage circuit.

As described above, the memory device 100 according to the inventive concept may generate different reference voltage sets with respect to each of the plurality of data lines DQ1 to DQn and may determine data signals of the plurality of data lines DQ1 to DQn, based on the different reference voltage sets.

Figure 3:
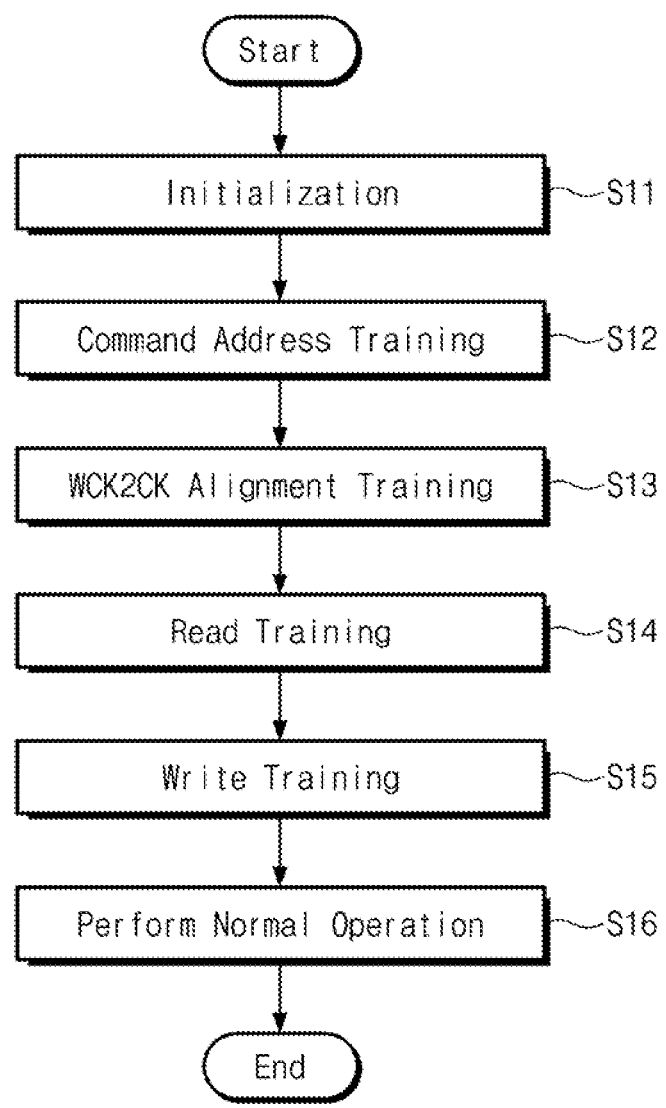
FIG. 3 is a flowchart illustrating an example operation of the memory system of FIG. 1.
Figure 4A:
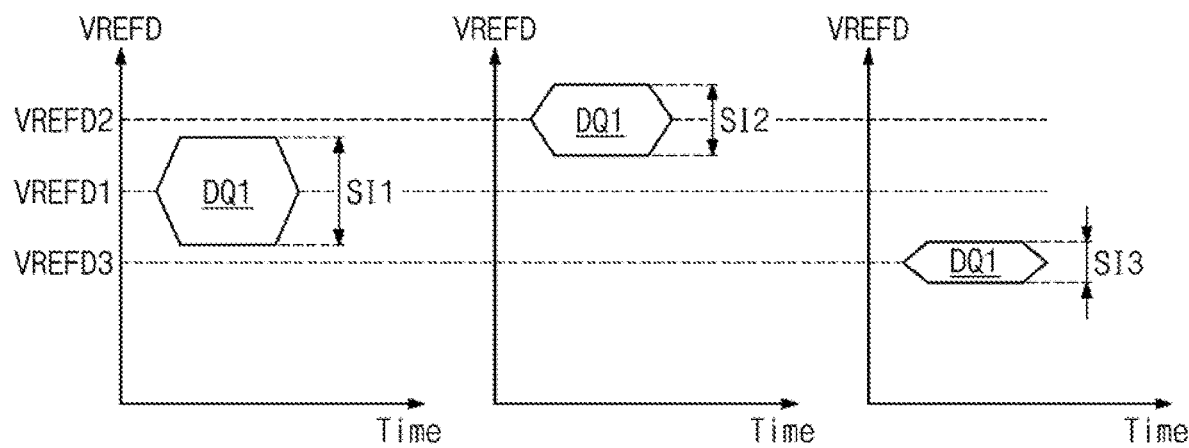
FIGS. 4A, 4B and 4C are each a graph for describing a reference voltage for each of a plurality of data lines.
Figure 4B:
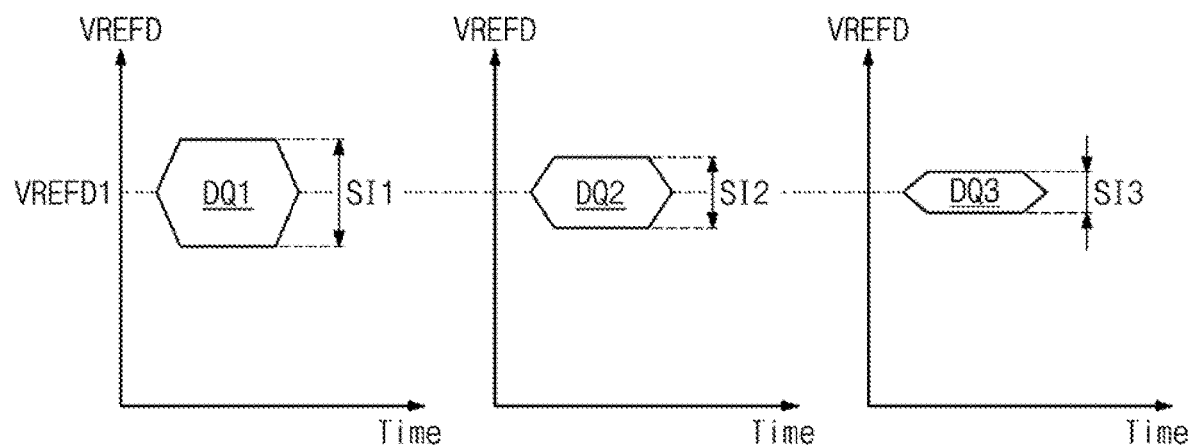
Figure 4C:
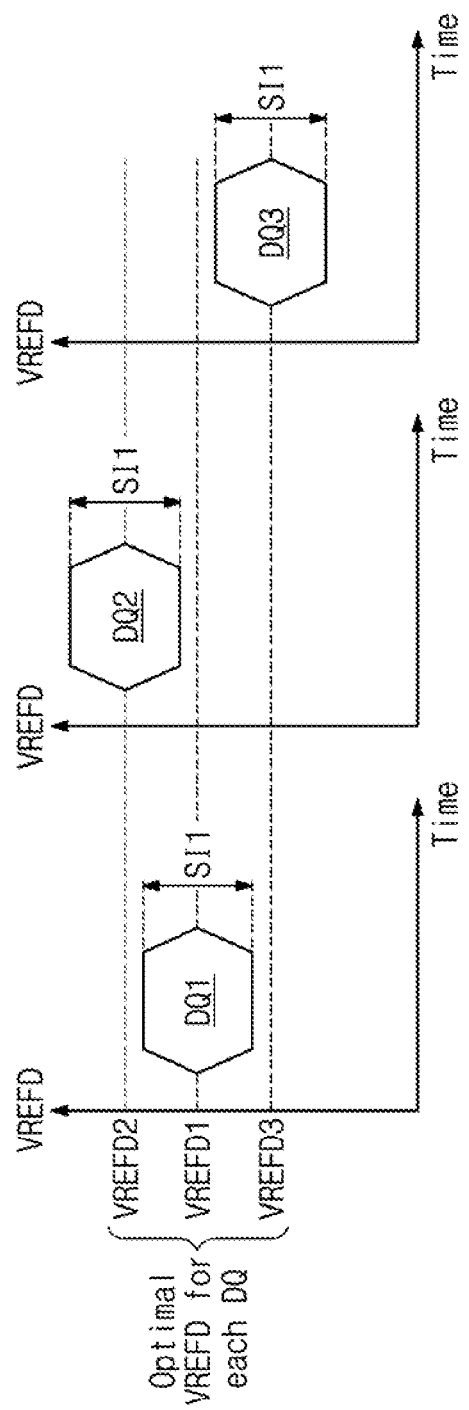

FIG. 3 is a flowchart illustrating an operation of the memory system 10 of FIG. 1. FIGS. 4A to 4C are graphs for describing a reference voltage for each of the plurality of data lines DQ1 to DQn. An initialization operation of the memory system 10 will be described with reference to FIG. 3. In an example embodiment, in a portion of the initialization operation, a reference voltage and a DFE level for each of the plurality of data lines DQ1 to DQn may be decided. Graphs of FIGS. 4A to 4C show a data-eye of a signal received through each data line DQ. In the graphs of FIGS. 4A to 4C, the X-axis denotes time, and the Y-axis denotes a level of a reference voltage.

Referring to FIGS. 1 and 3, in operation S11, the memory system 10 may perform an initialization operation. For example, when the memory system 10 is powered up, the host 11 and the memory device 100 may perform the initialization operation depending on a predefined manner. During the initialization operation, the host 11 may provide a power supply voltage to the memory device 100, may perform various initial setting operations, and may read necessary information from the memory device 100 or may set necessary information.

In operation S12, the memory system 10 may perform a command address training operation. For example, the host 11 and the memory device 100 may perform the command address training operation for the purpose of improving a timing margin of the command CMD and the address ADDR. In an example embodiment, the command address training operation may be selectively performed or omitted.

In operation S13, the memory system 10 may perform a clock alignment training operation. For example, the memory device 100 may receive a clock signal CK from the host 11 and may generate a data clock signal WCK, based on the received clock signal CK. In an example embodiment, a frequency of the data clock signal WCK may be "N" times a frequency (N being a natural number) of the clock signal CK. In a GDDR6 compliant embodiment, the clock alignment training operation may be a WCK2CK alignment training (an alignment of WCK to CK). The clock signal CK may be used to process the command CMD and the address ADDR, and the data clock signal WCK may be used to process data. The memory device 100 may perform the WCK2CK alignment training operation such that transition edges of the clock signal CK and the data clock signal WCK are synchronously aligned.

Due to variation in physical characteristics of the data lines DQ1 to DQn, each of the data lines may optimally supply data at a different voltage level. For this reason, it may be desirable to individually set a reference voltage for data signal determination for each of the data lines. Read and write training may be performed to determine such an optimum reference voltage level for each of the data lines DQ1 to DQn. In operation S14, the memory system 10 may perform a read training operation. For example, the host 11 may adjust settings values (e.g., reference voltage and/or a DFE value read from mode registers, etc.) of the memory device 100 such that the signal integrity or data-eye of data read from the memory device 100 is optimized. In an example embodiment, the read training operation may be independently performed on each of the plurality of data lines DQ1 to DQn.

In operation S15, the memory system 10 may perform a write training operation. For example, the host 11 may transmit data to the memory device 100 and may adjust settings values (e.g., reference voltage and/or a DFE value read from mode registers, etc.) of the memory device 100 such that the signal integrity or data-eye of the transmitted data is optimized. In an example embodiment, the write training operation may be independently performed on each of the plurality of data lines DQ1 to DQn. After the above-described initialization and training operation are performed in operation S11 to operation S15, in operation S16, the memory system 10 may perform a normal operation.

In an example embodiment, in operation S14 or S15, a reference voltage and DFE level for each of the plurality of data lines DQ1 to DQn may be decided. For example, as illustrated in FIG. 4A, when a reference voltage of the first data line DQ1 is set to a first reference voltage VREFD1, the first data line DQ1 may have a first signal integrity SI1. The upper and lower levels of the data eye may represent an average logic "1" and "0" level, respectively, of the data signal on that data line. If these levels are too close, the bit error rate may be unsuitably high. Therefore, a wider opening for the data eye is generally desirable. Varying the reference voltage VREF within a specified range may vary loading of the data line and produce different results for the data eyes. In the example of FIG. 4A, when the reference voltage of the first data line DQ1 is set to a second reference voltage VREFD2 or a third reference voltage VREFD3, the first data line DQ1 may have a second signal integrity SI2 smaller than the first signal integrity SI1 or a third signal integrity SI3 smaller than the first signal integrity SI1.

The signal integrity SI may indicate the size, a vertical height, or a width of a data-eye of a signal received through a data line DQ. That is, as the signal integrity SI becomes greater, data may be identified more accurately, with a lower bit error rate. In the illustrated example, when the reference voltage of the first data line DQ1 is set to the first reference voltage VREFD1, the first data line DQ1 may have optimal signal integrity.

Referring to FIG. 4B, when a reference voltage for the first to third data lines DQ1 to DQ3 is set to the first reference voltage VREFD1, the first to third data lines DQ1 to DQ3 may have first to third signal integrities SI1 to SI3, respectively. The reason is that physical characteristics of the first to third data lines DQ1 to DQ3 are different from each other. In other words, even though reference voltages of data lines are the same, the data lines may have different signal integrities due to locations or physical characteristics of the data lines. That is, when the reference voltage for the first to third data lines DQ1 to DQ3 is set to the first reference voltage VREFD1, the first data line DQ1 may have the optimal signal integrity, but the second and third data lines DQ2 and DQ3 may not have optimal signal integrities. For instance, the variation in characteristics may cause logic voltage levels to fluctuate between data lines, causing an increase in bit errors when sampling input data to determine bit values. Such bit errors may be particularly apparent in a DRAM device accessed by a high speed serial data bus (e.g. >1 GHz) that operates with relatively low logic voltages to conserve power.

Referring to FIG. 4C, a reference voltage of the first data line DQ1 may be set to the first reference voltage VREFD1, a reference voltage of the second data line DQ2 may be set to the second reference voltage VREFD2, and a reference voltage of the third data line DQ3 may be set to the third reference voltage VREFD3. In this case, each of the first to third data lines DQ1 to DQ3 may have an optimal signal integrity. In other words, each data line may have an optimal signal integrity by setting reference voltages of the first to third data lines DQ1 to DQ3 differently.

The above-described reference voltage of each data line may be decided through operation S14 or operation S15 (i.e., a read training operation or a write training operation), and information about the reference voltage of each data line may be stored in the storage circuit 170 as a portion of the CODE.

Although not illustrated in FIGS. 3 to 4C, in operation S14 or operation S15 (i.e., a read training operation or a write training operation), a DFE level may also be decided in a similar manner, and information about the DFE level may be stored in the storage circuit 170 as another portion of the CODE.

Figure 5:
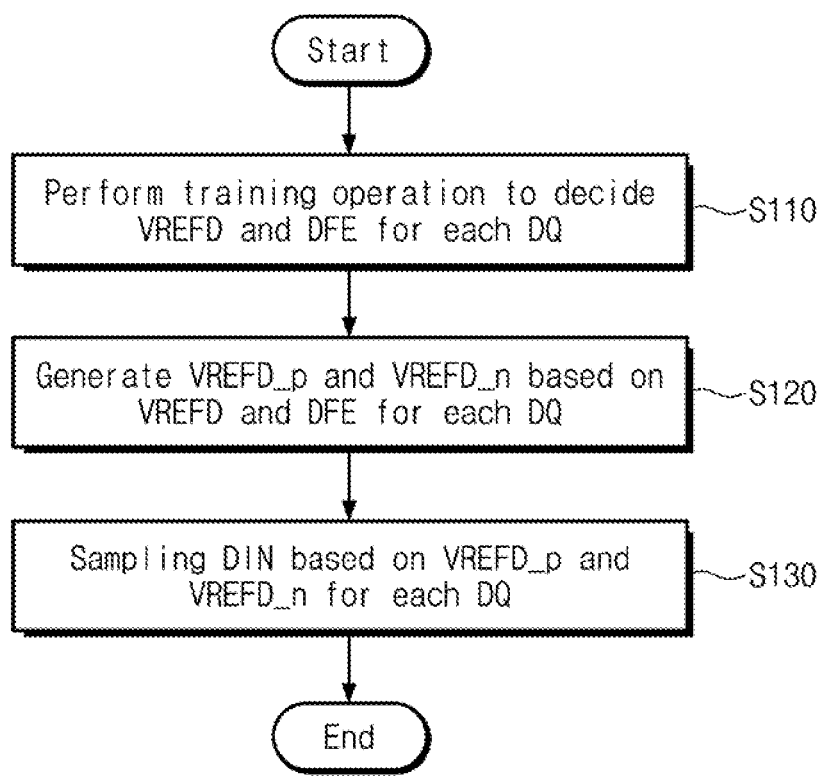
FIG. 5 is a flowchart illustrating an example operation of the memory device of FIG. 2.

FIG. 5 is a flowchart illustrating an operation of the memory device 100 of FIG. 2. Referring to FIGS. 2 and 5, in operation S110, the memory device 100 may perform a training operation to decide a reference voltage VREFD and a DFE level for each data line DQ. For example, as in the description given with reference to FIGS. 3 to 4C, the memory device 100 may decide the reference voltage VREFD and the DFE level for each data line DQ. The determined information may be stored in the storage circuit 170 as the CODE.

In operation S120, the memory device 100 may generate a reference voltage set including an upper reference voltage VREFD_p and a lower reference voltage VREFD_n, based on the reference voltage VREFD and the DFE level. In an example embodiment, a level of the upper reference voltage VREFD_p may be a level corresponding to a sum (VREFD+DFE) of the reference voltage VREFD and the DFE level, and a level of the lower reference voltage VREFD_n may be a level corresponding to a difference (VREFD−DFE) of the reference voltage VREFD and the DFE level.

In operation S130, the memory device 100 may sample data DIN input through each data line DQ, based on a reference voltage set including the upper reference voltage VREFD_p and the lower reference voltage VREFD_n. For example, the memory device 100 may determine any given data bit of a bit stream signal input through each data line DQ, based on a selected one of the upper reference voltage VREFD_p or the lower reference voltage VREFD_n.

Figure 6:
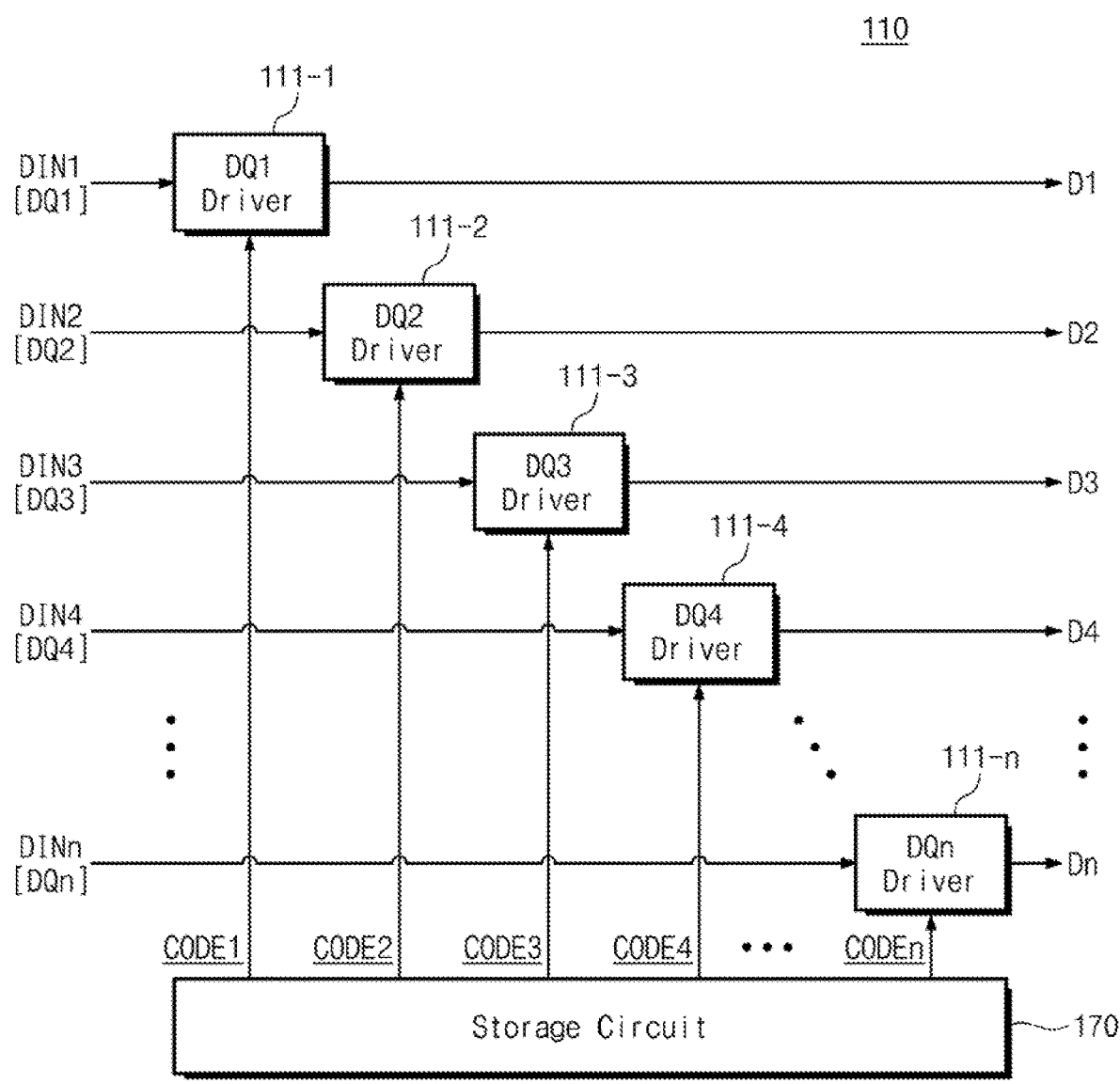
FIG. 6 is a block diagram illustrating an example DQ driving unit of FIG. 2.

FIG. 6 is a block diagram illustrating an example of the DQ driving unit 110 of FIG. 2. Below, for brevity, a DQ driving unit 110 is described as a receiver determining input data DIN. DQ driving unit 110 may also include a transmitter controlling each data line DQ, for the purpose of transmitting data to an external device (e.g., the host 11); and the transmission operations may be analogous to the receive operations discussed below.

Referring to FIGS. 2 and 6, the DQ driving unit 110 may include a plurality of data line drivers 111-1 to 111-n (hereinafter referred to as "DQ drivers"). The plurality of DQ drivers 111-1 to 111-n may respectively receive input data DIN1 to DINn through the plurality of data lines DQ1 to DQn. For example, the first DQ driver 111-1 may receive the first input data DIN1 through the first data line DQ1, and the second DQ driver 111-2 may receive the second input data DIN2 through the second data line DQ2. Likewise, the third to n-th DQ drivers 111-3 to 111-n may respectively receive third to n-th input data DIN3 to DINn through the third to n-th data lines DQ3 to DQn.

The plurality of DQ drivers 111-1 to 111-n may respectively receive a plurality of codes CODE1 to CODEn from the storage circuit 170 and may respectively generate reference voltage sets based on the received codes CODE1 to CODEn. For example, the first DQ driver 111-1 may receive the first code CODE1 from the storage circuit 170 and may generate a reference voltage set based on the received first code CODE1. The second DQ driver 112 may receive the second code CODE2 from the storage circuit 170 and may generate a reference voltage set based on the received second code CODE2. Likewise, the third to n-th DQ drivers 111-3 to 111-n may respectively receive the third to n-th codes CODE3 to CODEn from the storage circuit 170 and may respectively generate reference voltage sets based on the received third to n-th codes CODE3 to CODEn.

In this case, the reference voltage sets generated in the first to n-th DQ drivers 111-1 to 111-n may be different from each other. Alternatively, a reference voltage set generated in at least one of the first to n-th DQ drivers 111-1 to 111-n may be different from reference voltage sets generated in the remaining DQ drivers.

The plurality of DQ drivers 111-1 to 111-n may respectively sample the plurality of input data DIN1 to DINn input through the plurality of data lines DQ1 to DQn, based on generated reference voltages and may identify first to n-th data D1 to Dn as the sampling result. For example, the first DQ driver 111-1 may sample the first input data DIN1, based on the generated reference voltage and may output the first data D1 as the sampling result. The second DQ driver 111-2 may sample the second input data DIN2, based on the generated reference voltage and may output the second data D2 as the sampling result. Likewise, the third to n-th DQ drivers 111-3 to 111-n may respectively sample the third to n-th input data DIN3 to DINn, based on the generated reference voltages and may respectively output the third to n-th data D3 to Dn as the sampling result.

As described above, the DQ driving unit 110 may sample the input data DIN by using different reference voltages, with respect to the plurality of data lines DQ1 to DQn. Accordingly, since the optimal signal integrity for each of the plurality of data lines DQ1 to DQn is obtainable, the integrity of the input data DIN is improved and a bit error rate may be reduced.

Figure 7:
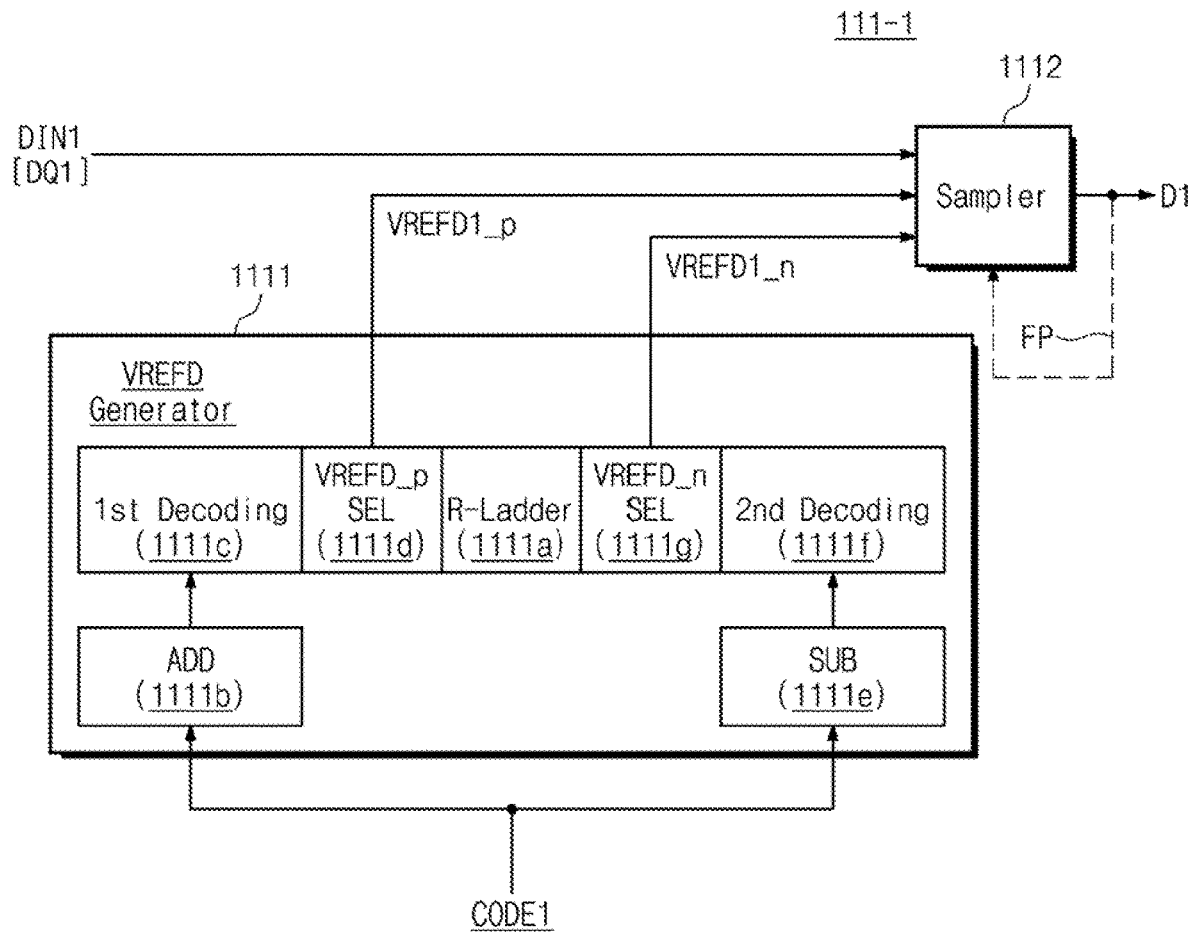
FIG. 7 is a block diagram illustrating an example configuration for the first DQ driver of FIG. 6.

FIG. 7 is a block diagram illustrating an example configuration for the first DQ driver 111-1 of FIG. 6. Note that the same configuration may be used for any of the other DQ drivers 111-2 to 111-n.

The first DQ driver 111-1 may include a reference voltage generator 1111 and a sampler 1112. The reference voltage generator 1111 may generate a first upper reference voltage VREFD1_p and a first lower reference voltage VREFD1_n. For example, the reference voltage generator 1111 may include a resistor ladder 1111a, an adder 111b, a first decoding unit 1111c, an upper reference voltage selector 1111d, a subtractor 1111e, a second decoding unit 1111f, and a lower reference voltage selector 1111g.

The resistor ladder 1111a may include a plurality of resistors connected in series or in parallel. The resistor ladder 1111a may divide a power supply voltage VDDQ applied thereto to generate various voltages. Resistor ladder 1111a may concurrently provide the first upper reference voltage VREFD1_p and the first lower reference voltage VREFD1_n to the upper reference voltage selector 1111d and the lower reference voltage selector 1111g, respectively.

The adder 1111b may be configured to receive the first code CODE1 and to add a first reference voltage VREFD1 and a first DFE level included in the received first code CODE1. For example, as described above, the first code CODE1 may be decided in a read training or write training operation, and may include a first bit sequence representing the first reference voltage VREFD1 and a second bit sequence representing the first DFE level associated with the first data line DQ1. The adder 1111b may add the first reference voltage VREFD1 and the first DFE level (i.e., VREFD1+DFE1) and may output the addition result in the form of a digital code.

The first decoding unit 1111c may decode the addition result from the adder 1111b. The upper reference voltage selector 1111d may output one of a plurality of voltages from the resistor ladder 1111a as the first upper reference voltage VREFD1_p, based on the decoding result of the first decoding unit 1111c.

The subtractor 1111e may be configured to receive the first code CODE1 and to perform a subtraction operation on the first reference voltage VREFD1 and the first DFE level included in the received first code CODE1. For example, as described above, the first code CODE1 may be decided in a read training or write training operation, and may include bit sequences representing the first reference voltage VREFD1 and the first DFE level, respectively, associated with the first data line DQ1. The subtractor 1111e may subtract the first DFE level from the first reference voltage VREFD1 (i.e., VREFD1−DFE1) and may output the subtraction result in the form of a digital code.

The second decoding unit 1111f may decode the subtraction result from the subtractor 1111e. The lower reference voltage selector 1111f may output one of the plurality of voltages from the resistor ladder 1111a as the first lower reference voltage VREFD1_n, based on the decoding result of the second decoding unit 1111f.

As described above, the reference voltage generator 1111 may generate the first upper reference voltage VREFD1_p and the first lower reference voltage VREFD1_n, based on the first code CODE1. Here, the first upper reference voltage VREFD1_p may be a sum (i.e., VREFD1+DFE1) of the first reference voltage VREFD1 and the first DFE level, and the first lower reference voltage VREFD1_n may be a difference (i.e., VREFD1−DFE1) of the first reference voltage VREFD1 and the first DFE level.

Figure 8:
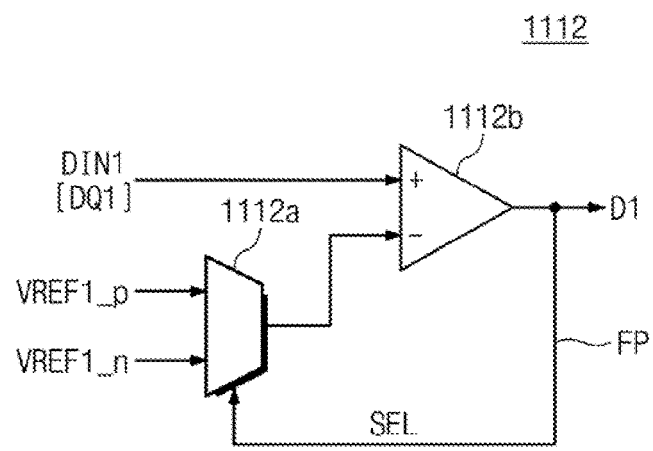
FIG. 8 is a view illustrating an example sampler of FIG. 7.

The sampler 1112 may sample the first input data DIN1 (a bit stream) received through the first data line DQ1, based on the first upper reference voltage VREFD1_p (for some of the bits in the bit stream) and the first lower reference voltage VREFD1_n (for other bits of the bit stream) and may output the first data D1 as the sampling result. In particular, a feedback path FP may be provided from the output of sampler 1112 back to an internal circuit selection circuit of sampler 1112. In accordance with a DFE scheme for reducing Inter Symbol Interference, when the previous bit value of the first data D1 was determined to be a "1", the internal selection circuit causes sampler 1112 to sample the current bit of the first input data DIN1 by comparing the current bit's voltage level with the upper reference voltage VREF_p. When the previous bit value of the first data D1 was determined to be a "0", the internal selection circuit causes sampler 1112 to sample the current bit of the first input data DIN1 by comparing the current bit's voltage level with the lower reference voltage VREF_n. This technique may effectively amount to a filtering mechanism by which bit errors are reduced. FIG. 8 schematically illustrates an example sampler 1112, which may include a comparator 1112b and a multiplexer 1112a. The comparator 1112b may compare one of the first upper reference voltage VREFD1_p and the first lower reference voltage VREFD1_n with the first input data DIN1 and may output the first data D1 as the sampling result.

In detail, in the first input data DIN1, it is assumed that bit "1" is a signal corresponding to a high level and bit "0" is a signal corresponding to a low level. The comparator 1112b may output bit "1" as the first data D1 when a voltage of a signal of the first data line DQ1 is higher than one of the first upper reference voltage VREFD1_p and the first lower reference voltage VREFD1_n and may output bit "0" as the first data D1 when the voltage of the signal of the first data line DQ1 is lower than one of the first upper reference voltage VREFD1_p and the first lower reference voltage VREFD1_n.

The multiplexer 1112a may select one of the first upper reference voltage VREFD1_p and the first lower reference voltage VREFD1_n depending on a selection signal SEL and may provide the selected reference voltage to the comparator 1112b. In an example embodiment, the selection signal SEL may be provided from the feedback path FP or a buffer circuit (not shown) coupled to the feedback path FP. That is, the selection signal SEL may be based on a previous output signal of the comparator 1112b. For example, when bit "1" is output as the first data D1, the first upper reference voltage VREFD1_p may be selected to determine a next data bit; when bit "0" is output as the first data D1, the first lower reference voltage VREFD1_n may be selected to determine a next data bit. For this reason, even though a signal corresponding to the first input data DIN1 received through the first data line DQ1 does not fully swing (due to inter symbol interference), data may be determined with a satisfactorily low bit error rate because one of the first upper reference voltage VREFD1_p and the first lower reference voltage VREFD1_n is selected based on a previously determined bit value. More specifically, if the previous data bit was a "1", ISI tends to increase the voltage of the current data bit, whereby an increase in the reference voltage to VREF1_p leads to less bit errors. Conversely, if the previous data bit was a "0", ISI tends to reduce the voltage of the current data bit, so that a decrease in the reference voltage to VREF1_n may reduce the occurrence of bit errors.

As described above, a DQ driver according to the inventive concept may generate an upper reference voltage and a lower reference voltage for each of a plurality of data lines individually, based on a reference voltage and a DFE level decided through a read or write training operation and may determine input data received through the respective data line, based on the generated upper and lower reference voltages for that data line, thereby improving the integrity of data. In addition, the concurrent provision of both the upper and lower voltages VREFD1_p and VREFD1_n based on the CODE1 may allow for a faster response to the output data D1 in the feedback path FP, and therefore, a reduced bit error rate, as compared to conventional approaches that generate a single DFE-adjusted reference voltage from a resistor ladder based on the output data D1.

In an example embodiment, upper reference voltages generated in the plurality of DQ drivers 111-1 to 111-n may be different from each other, and lower reference voltages generated in the plurality of DQ drivers 111-1 to 111-n may be different from each other. That is, the integrity of data may be secured with respect to each of the plurality of data lines DQ1 to DQn, by differently setting reference voltages (i.e., upper and lower reference voltages, or a reference voltage and a DFE level) for the plurality of data lines DQ1 to DQn.

Figure 9:
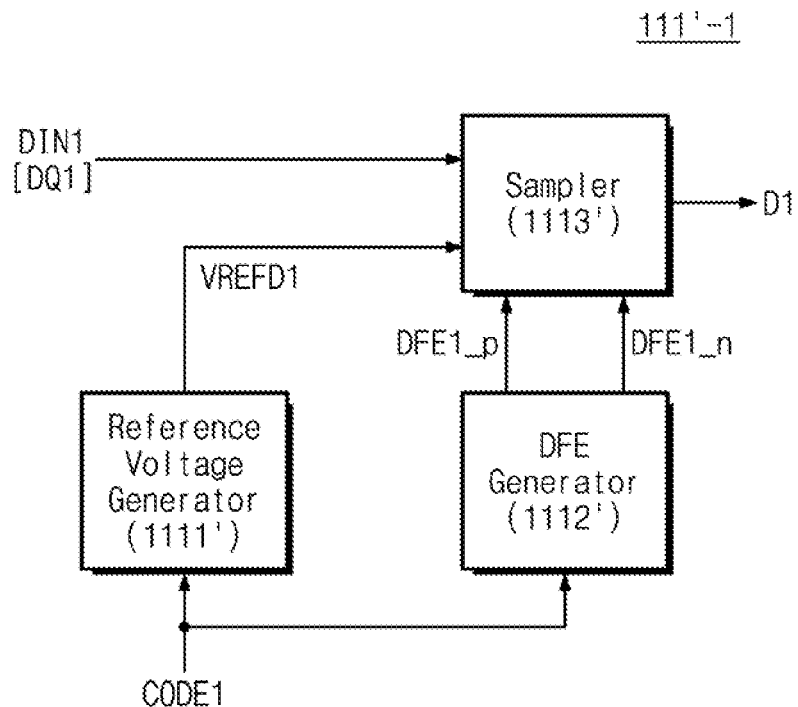
FIG. 9 is a block diagram illustrating another example of the first DQ driver of FIG. 6.
Figure 10:
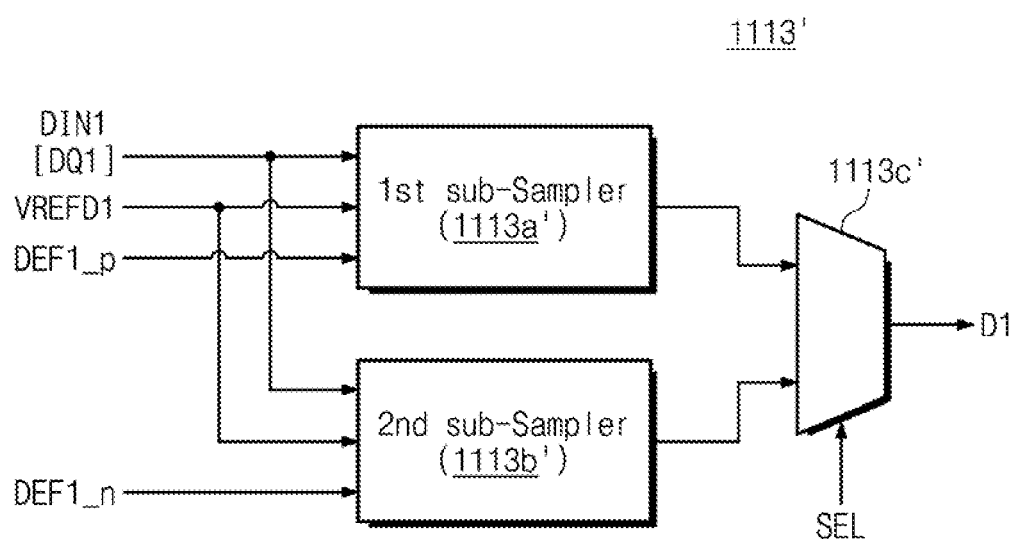
FIG. 10 is a block diagram illustrating an example sampler of FIG. 9.

FIG. 9 is a block diagram illustrating another example of the first DQ driver 111-1 of FIG. 6. The shown configuration may likewise be used for any one of the other DQ drivers 111-2 to 111-n. FIG. 10 is a block diagram illustrating an example sampler 1113' of FIG. 9. Referring to FIGS. 9 and 10, the first DQ driver 111'-1 may include a reference voltage generator 1111', a DFE level generator 1112', and a sampler 1113'. The reference voltage generator 1111' may receive the first code CODE1 and may generate a first reference voltage VREFD1, based on the received first code CODE1. The DFE level generator 1112' may receive the first code CODE1 and may generate a first DFE positive level DFE1_$p$ and a first DFE negative level DEF1_$n$, based on the received first code CODE1. In an example embodiment, the first DFE positive level DFE1_$p$ may be a positive value, and the first DFE negative level DEF1_$n$ may be a negative value. It is noted here that the first DFE positive level DFE1_$p$ and a first DFE negative level DEF1_$n$ may together constitute another example of a reference voltage set.

The sampler 1113' may sample the first input data DIN1 received through the first data line DQ1, based on the first reference voltage VREFD1, the first DFE positive level DFE1_$p$, and the first DFE negative level DEF1_$n$ and may output the first data D1 as the sampling result. For example, as illustrated in FIG. 10, the sampler 1113' may include a first sub-sampler 1113$a$', a second sub-sampler 1113$b$', and a multiplexer 1113$c$'.

The first sub-sampler 1113$a$' may sample the first input data DIN1 received through the first data line DQ1, based on the first reference voltage VREFD1 the first DFE positive level DFE1_$p$. The second sub-sampler 1113$b$' may sample the first input data DIN1 received through the first data line DQ1, based on the first reference voltage VREFD1 the first DFE negative level DEF1_$n$.

The multiplexer 1113$c$' may select one of outputs of the first and second sub-samplers 1113$a$' and 1113$b$' depending on the selection signal SEL and may output the selected output as the first data D1. In an example embodiment, the selection signal SEL may be decided according to a value or level of the first data D1. As in the above description, when the first data D1 currently determined is bit "1" (i.e., in a high level), in a next bit determination operation, the selection signal SEL may be decided such that the output of the first sub-sampler 1113$a$' is selected. In contrast, when the first data D1 currently determined is bit "0" (i.e., in a low level), in a next bit determination operation, the selection signal SEL may be decided such that the output of the second sub-sampler 1113$b$' is selected.

As described above, a plurality of DQ drivers may generate different reference voltages with respect to a plurality of data lines and may sample input data, based on the generated reference voltages. Accordingly, optimal integrity of data for each of the plurality of data lines DQ1 to DQn may be obtained.

Figure 11:
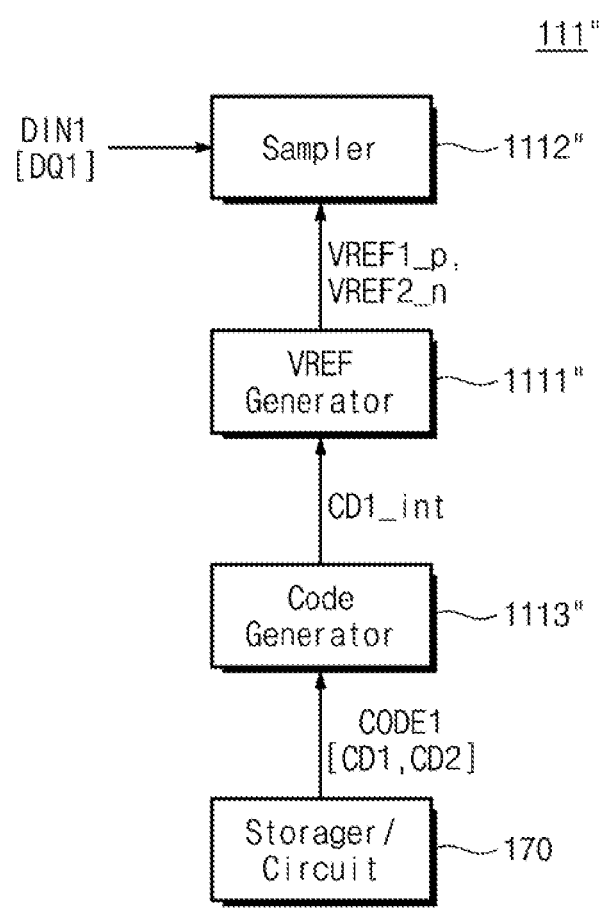
FIG. 11 is a block diagram for describing an example first DQ driver of FIG. 6.

FIG. 11 is a block diagram illustrating an example DQ driver, 111". DQ driver 111" is explained below as an example of the first DQ driver 111-1 of FIG. 6, but the configuration may be used for any of the DQ drivers 111-1 to 111-n.

DQ driver 111" may include a code generator 1113", a reference voltage generator 1111", and a sampler 1112". The code generator 1113" may receive a relevant code (i.e., the first code CODE1) from the storage circuit 170 and may generate a first internal code CD1_int based on the received first code CODE1. For example, the first code CODE1 may include a first sub-code CD1 indicating reference voltage information for the first data line DQ1 and a second sub-code CD2 indicating a DFE level for the first data line DQ1. The code generator 1113" may combine the first and second sub-codes CD1 and CD2 included in the first code CODE1 to generate the first internal code CD1_int.

The first internal code CD1_int may include an addition code obtained by adding the first sub-code CD1 and the second sub-code CD2 and a subtraction code obtained by subtracting the second sub-code CD2 from the first sub-code CD1. In an example embodiment, the first sub-code CD1 may be a code stored in mode register MR6 (defined in the GDDR6 standard), and the second sub-code CD2 may be a code stored in mode register MR9. In this case, a portion of the first internal code CD1_int may represent a voltage addition of voltages represented in mode registers MR6 and MR9, and another portion of the first internal code CD1 may represent a subtraction of voltage represented by the code in mode register MR9 from that in MR6.

The reference voltage generator 1111" may generate a first reference voltage set (VREF_1$p$, VREF1_$n$), based on the first internal code CD1_int. The sampler 1112" may determine the first input data DIN1 received through the first data line DQ1, based on the first reference voltage set (VREF1_$p$, VREF1_$n$).

Figure 12:
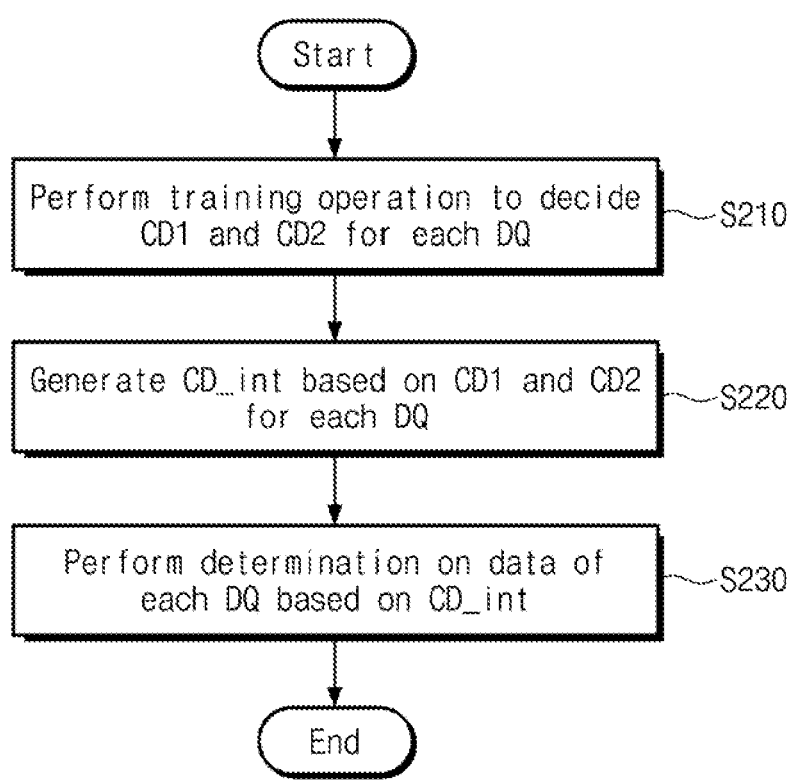
FIG. 12 is a flowchart for describing an example operation of the memory device using the first DQ driver of FIG. 11.

FIG. 12 is a flowchart for describing an operation of the memory device 100 using the first DQ driver 111" of FIG. 11. Referring to FIGS. 11 and 12, in operation S210, the memory device 100 may perform a training operation to decide the first and second sub-codes CD1 and CD2 for each data line DQ. For example, as described above, the memory device 100 may generate the first sub-code CD1 indicating information about a reference voltage of each data line DQ and the second sub-code CD2 indicating information about a DFE level, through a read or write training operation. In an example embodiment, as described above, the first sub-codes CD1 of data lines DQ may be different from each other, and the second sub-codes CD2 of the data lines DQ may be different from each other.

In operation S210, the memory device 100 may generate an internal code CD_int, based on the first and second sub-codes CD1 and CD2 for each data line DQ. For example, the memory device 100 may differently generate the internal code CD_int for each data line DQ, based on the first and second sub-codes CD1 and CD2 for each data line DQ.

In operation S230, the memory device 100 may determine data received through each data line DQ, based on the internal code CD_int. For example, as described above, the memory device 100 may generate a reference voltage set for each data line DQ, based on the internal code CD_int and may determine data received through each data line, based on the generated reference voltage set.

As described above, a memory device according to an embodiment of the inventive concept may generate an internal code for each data line DQ, based on a different code and may determine data, based on the generated internal code.

Figure 13:
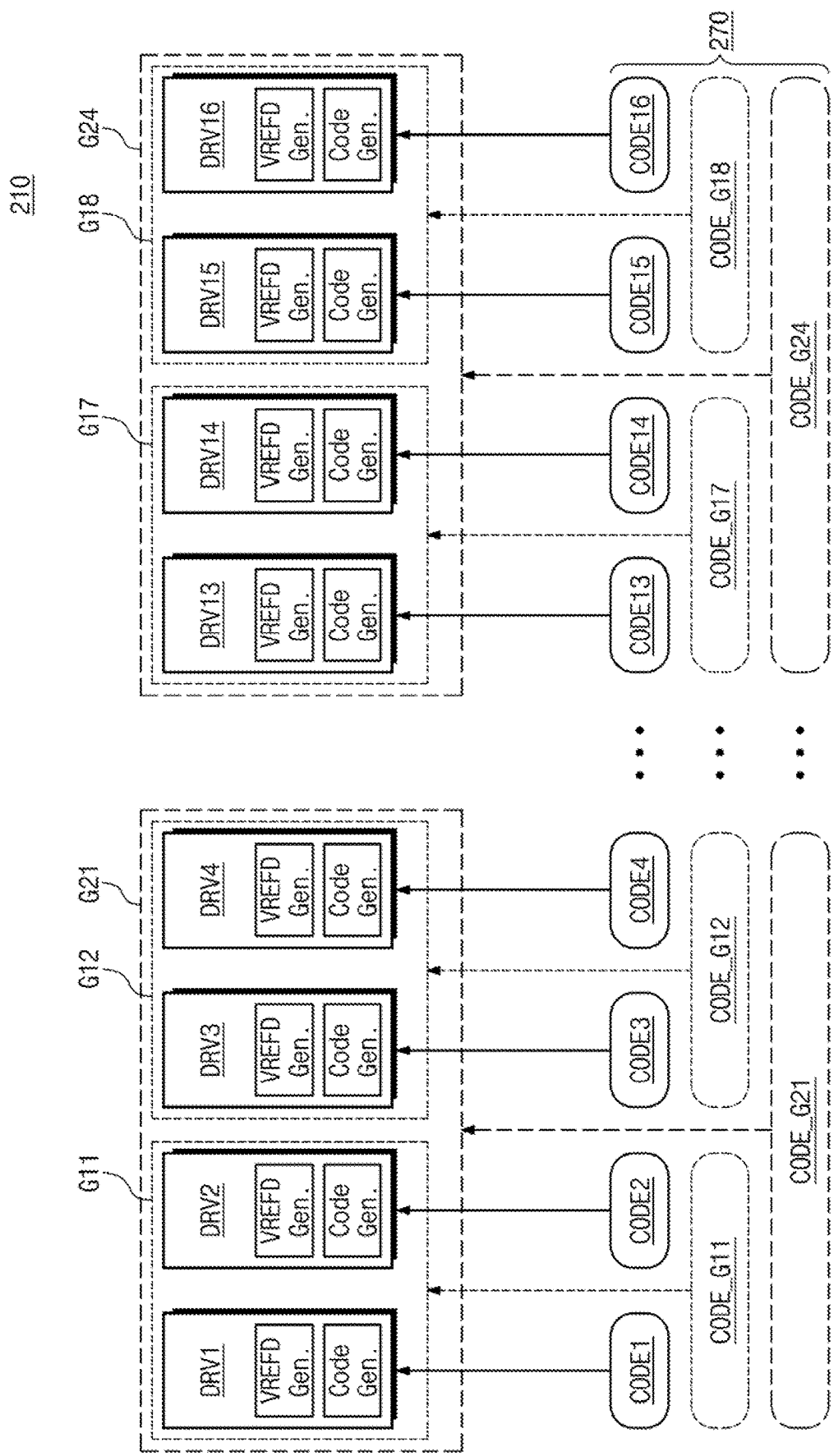
FIG. 13 schematically illustrates a DQ driving unit according to an embodiment of the inventive concept.

FIG. 13 is a block diagram illustrating an example DQ driving unit 210 according to an embodiment of the inventive concept. In this example, DQ driving unit 210 may include first to sixteenth DQ drivers DRV1 to DRV16. Each of the first to sixteenth DQ drivers DRV1 to DRV16 may include components described with reference to FIGS. 7 to 10. For instance, DQ1 driver 111-1 may be an example of DQ driver DRV1; DQ2 driver 111-2 may be an example of DQ driver DRV2; etc. As described above, the first to sixteenth DQ drivers DRV1 to DRV16 may be respectively connected with a plurality of data lines (e.g., DQ1 to DQ16) and may be configured to control the plurality of data lines (e.g., DQ1 to DQ16).

The first to sixteenth DQ drivers DRV1 to DRV16 may respectively receive the first to sixteenth codes CODE1 to CODE16 from a storage circuit 270. Each of the first to sixteenth DQ drivers DRV1 to DRV16 may generate a reference voltage, a DFE level, an upper reference voltage, and/or a lower reference voltage, based on the received code. In this case, the generated voltages may have different levels depending on characteristics of data lines. For example, each of the first to sixteenth DQ drivers DRV1 to DRV16 may include a reference voltage generator and a code generator. In each of the first to sixteenth DQ drivers DRV1 to DRV16, the code generator may receive the corresponding code and may generate an internal code based on the received code. In each of the first to sixteenth DQ drivers DRV1 to DRV16, the reference voltage generator may generate a reference voltage set based on the generated internal code. For example, the "VREFD Generator" of the first DQ driver DRV1 may generate a first reference voltage set while the "VRFED Generator" of the thirteenth driver DRV13 may generate a thirteenth reference voltage set that differs from the first reference voltage set.

Alternatively, the first to sixteenth DQ drivers DRV1 to DRV16 may be grouped, where each group receives a common code from storage circuit 270, and each DQ driver within the same group may generate the same reference voltages based on the common code. For example, the first and second DQ drivers DRV1 and DRV2 may constitute a first group G11. The third and fourth DQ drivers DRV3 and DRV4 may constitute a second group G12. Likewise, the remaining DQ drivers may be grouped in units of two. In this case, a plurality of codes CODE_G11 to CODE_G18 may be respectively provided to a plurality of groups G11 to G18.

Alternatively, the first to fourth DQ drivers DRV1 to DRV4 may constitute a first group G21. Likewise, the remaining DQ drivers may be grouped in units of four. In this case, a plurality of codes CODE_G21 to CODE_G24 may be respectively provided to a plurality of groups G21 to G24. Each DQ driver belonging to the same group may generate a reference voltage, a DFE level, an upper reference voltage, and/or a lower reference voltage by using the same code.

In other words, the plurality of DQ drivers DRV1 to DRV16 may be grouped in units of $2^N$ or $2^{N+1}$ (N being a natural number), and each DQ driver belonging to the same group may generate a reference voltage, a DFE level, an upper reference voltage, or a lower reference voltage by using the same code.

Although the first to sixteenth DQ drivers DRV1 to DRV16 are illustrated in FIG. 13, the number of DQ drivers may vary with the number of data lines connected with a host. Also, DQ drivers may be grouped in other ways. For instance, DQ drivers that are physically adjacent may belong to the same group. In other words, DQ drivers may be grouped based on an adjacency criterion.

In the above-described embodiments of FIGS. 1-13, data receiving operations of a DQ driving unit for writing input data to memory device 100 have been described. For transmitting data read from memory device 100 to an external device such as host 11, a plurality of DQ drivers of a DQ driving unit may respectively control a plurality of data lines. In this case, the plurality of DQ drivers may respectively control the plurality of data lines by using different DFE levels.

Figure 14:
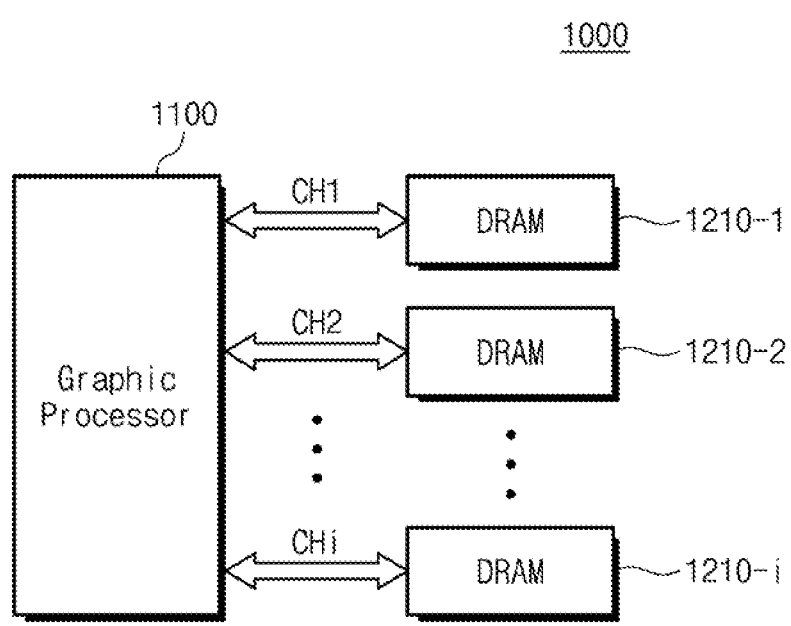
FIG. 14 is a block diagram illustrating an example graphic system to which the memory device according to the inventive concept may be applied.

FIG. 14 is a block diagram illustrating a graphic system, 1000, to which a memory device according to the inventive concept may be applied. Graphic system 1000 may include a graphic processor 1100 and a plurality of DRAM devices 1210-1 to 1210-i. The graphic processor 1100 may be configured to perform various operations for processing image information. The graphic processor 1100 may be connected with the plurality of DRAM devices 1210-1 to 1210-i through a plurality of channels CH1 to CHi. In an example embodiment, each of the plurality of channels CH1 to CHi may be a communication channel that is based on a graphic double data rate (GDDR) interface such as a GDDR6 compliant interface.

Each of the plurality of DRAM devices 1210-1 to 1210-i may include the memory device 100 described with reference to FIGS. 1 to 13. That is, each of the plurality of DRAM devices 1210-1 to 1210-i may include a memory cell array 120 and may determine data based on different reference voltages, with respect to a plurality of data lines.

Figure 15:
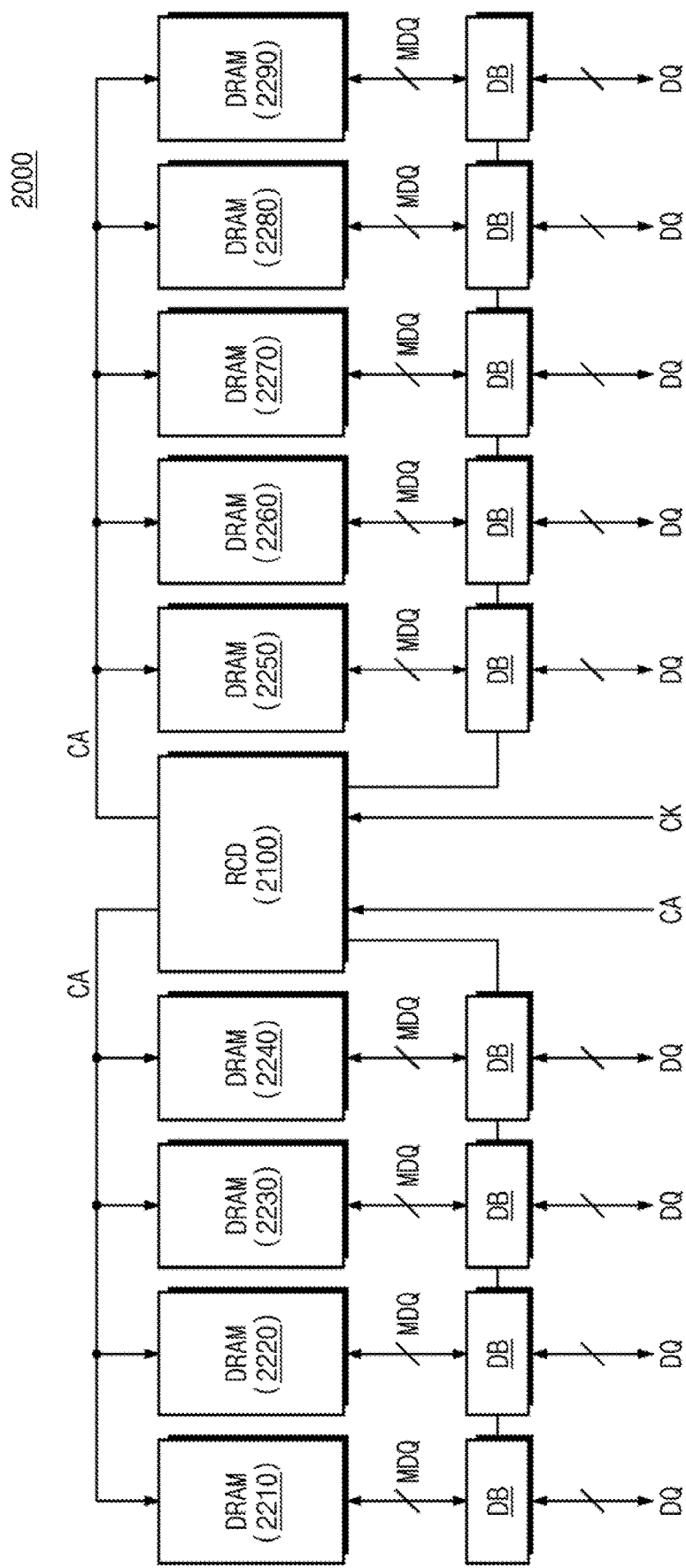
FIG. 15 is a block diagram illustrating an example memory module to which the memory device according to the inventive concept may be applied.

FIG. 15 is a block diagram illustrating a memory module, 2000, to which a memory device according to the inventive concept may be applied. Memory module 2000 may be a memory system that may include a register clock driver (RCD) 2100, a plurality of DRAM devices 2210 to 2290, and a plurality of data buffers DB.

The RCD 2100 may receive a command/address CA and a clock signal CK from an external device (e.g., a host or a memory controller). Based on the received signals, the RCD 2100 may send the command/address CA to the plurality of DRAM devices 2210 to 2290 and may control the plurality of data buffers DB.

The plurality of DRAM devices 2210 to 2290 may be respectively connected with the plurality of data buffers DB through memory data lines MDQ. In an example embodiment, the plurality of DRAM devices 2210 to 2290 may each include a memory cell array 120 and a DQ driving unit 110 described with reference to FIGS. 1 to 11. That is, each of the plurality of DRAM devices 2210 to 2290 may determine or transmit data based on different reference voltages, with respect to relevant memory data lines MDQ.

The plurality of data buffers DB may transmit and receive data to and from an external device (e.g., a host or a memory controller) through a plurality of data lines DQ.

In an example embodiment, the memory module 2000 illustrated in FIG. 15 may have the form factor of a load reduced dual in-line memory module (LRDIMM). In other embodiments, the memory module 2000 illustrated in FIG. 15 may have the form factor of a registered DIMM (RDIMM) in which the plurality of data buffers DB are not included.

Figure 16:
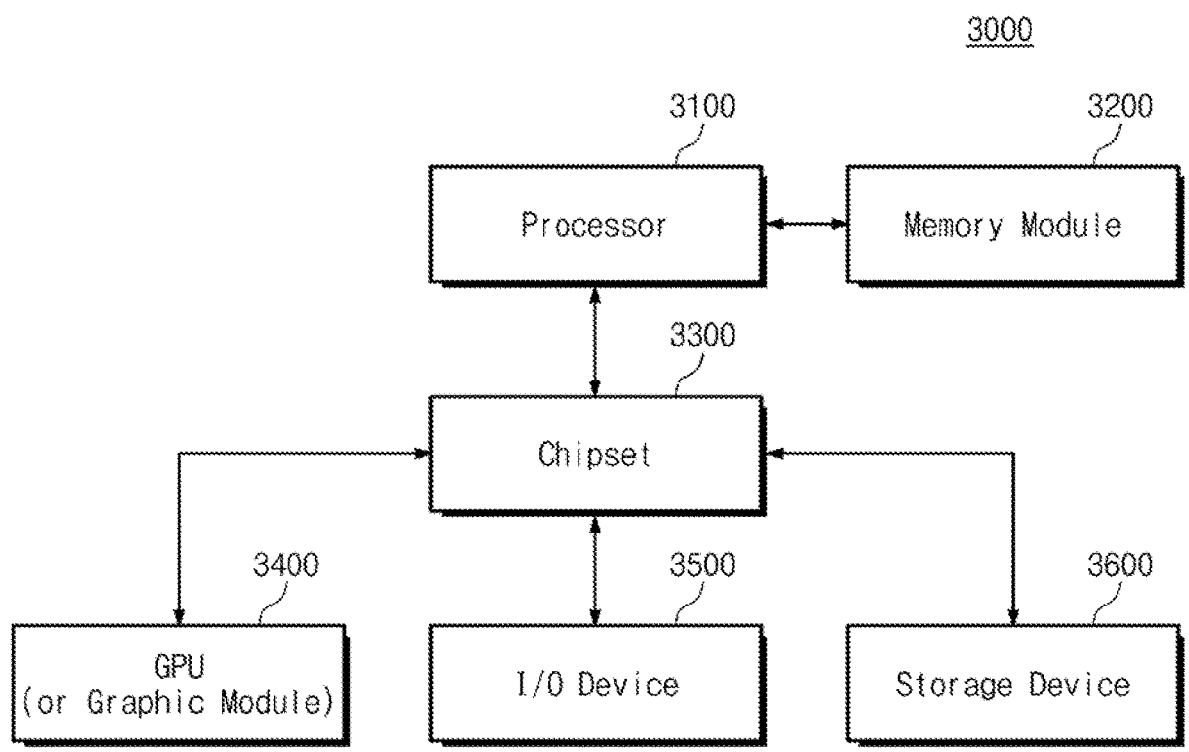
FIG. 16 is a block diagram illustrating an example computing system to which the memory device according to the inventive concept may be applied.

FIG. 16 is a block diagram illustrating a computing system 3000 to which a memory device according to the inventive concept is applied. Computing system 3000 may include one of a computer, a portable computer, a ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, a wearable device, or various electronic devices including a home network.

The computing system 3000 may include a processor 3100, a memory module 3200, a chipset 3300, a graphic processing unit (GPU) (or a graphic module) 3400, an input/output device 3500, and a storage device 3600. The processor 3100 may perform overall operations of the computing system 3000. The processor 3100 may perform various operations in the computing system 3000.

The memory module 3200 may be directly connected with the processor 3100. For example, the memory module 3200 may have a form of a dual in-line memory module (DIMM), and the memory module 3200 may be installed in a DIMM socket directly connected with the processor 3100 and may communicate with the processor 3100. In an example embodiment, the memory module 3200 may include any of the memory devices described with reference to FIGS. 1 to 14. That is, the memory module 3200 may individually control a plurality of data lines DQ, based on different reference voltages and/or different reference voltage sets.

The chipset 3300 may be electrically connected to the processor 3100 and may control hardware of the computing system 3000 under control of the processor 3100. For example, the chipset 3300 may be connected with each of the GPU 3400, the input/output device 3500, and the storage device 3600 through main buses, and may perform a bridge operation with respect to the main buses.

The GPU 3400 may perform a series of arithmetic operations for outputting image data of the computing system 3000. In an example embodiment, the GPU 3400 may be embedded in the processor 3100 in the form of a system-on-chip. In an example embodiment, the GPU 3400 may include any of the memory devices described with reference to FIGS. 1 to 14. That is, a memory device included in the GPU 3400 may control a plurality of data lines DQ, based on different reference voltages and/or different reference voltage sets.

The input/output device 3500 may include various devices that make it possible to input data or an instruction to the computing system 3000 or to output data to an external device. The storage device 3600 may be used as a mass storage medium of the computing system 3000. The storage device 3600 may include mass storage media such as a hard disk drive (HDD), a solid state drive (SSD), a memory card, and a memory stick.

As described above, a memory device according to the inventive concept may exchange data with an external device (e.g., a host or a memory controller) through a plurality of data lines. In this case, the memory device may individually control a plurality of data lines DQ, based on different reference voltages. Accordingly, since an optimal data integrity for each data line is secured, a memory device having improved reliability is provided.

According to the inventive concept, a memory device may individually control a plurality of data lines, based on different reference voltages. Accordingly, since an optimal data integrity or data-eye for each data line is secured, a memory device having improved reliability and an operation method thereof are provided. The memory device may individually control a plurality of data lines DQ based on different reference voltage sets, where each set contains a plurality of concurrently provided voltages, and where the value of each symbol of an input data stream may be determined based on a selected one of the plurality of voltages. When using one of the plurality of voltages in conjunction with a noise/error reduction scheme such as DFE, a fast response time may be achievable, which may result in a bit error rate reduction.

As mentioned earlier, an element which performs a specific function or includes a specific function, described herein with such terms as "block", "unit", "module", "driver", or the like, is implemented with hardware circuitry. Any such element may be alternatively called a "circuit", "circuitry" or the like. For instance, a driver, a data line driving unit, a generator, a sampler, a selector, a decoder, an adder, or a subtractor, as described above, may be alternatively referred to interchangeably as a driver circuit, a data line driving circuit, a generator circuit, a sampler circuit, a selector circuit, a decoder circuit, an adder circuit, and a subtractor circuit, respectively.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory system comprising:
a memory device; and
a memory controller configured to transmit input data to the memory device through a first data line and a second data line,
wherein the memory controller is further configured to store first to fourth codes in the memory device by performing a training operation, the first code including information of a first reference voltage level associated with the first data line, the second code including information of a first decision feedback equalization (DFE) level associated with the first data line, the third code including information of a second reference voltage level associated with the second data line, and the fourth code including information of a second DFE level associated with the second data line;
wherein the memory device comprises:
a first data line driver circuit configured to generate a first reference voltage set based on the first and second codes associated with the first data line, and to determine first bit values of the input data received through the first data line based on the first reference voltage set; and
a second data line driver circuit configured to generate a second reference voltage set based on the third and fourth codes associated with the second data line, and to determine second bit values of the input data received through the second data line based on the first reference voltage set.

2. The memory system of claim 1, wherein the memory device further comprises a storage circuit configured to store the first to fourth codes.

3. The memory system of claim 2, wherein the storage circuit comprises:
a MR6 mode register configured to store the first code and the third code; and
a MR9 mode register configured to store the second code and the fourth code.

4. The memory system of claim 3, wherein the memory controller stores the first to fourth codes in the MR6 and MR9 mode registers through a mode register set operation.

5. The memory system of claim 1, wherein the first and second reference voltage levels are different from each other, or
the first and second DFE levels are different from each other.

6. The memory system of claim 1, wherein:
the first reference voltage set comprises a first upper reference voltage equaling a sum of the first reference voltage level and the first DFE level, and a first lower reference voltage equaling the first reference voltage level minus the first DFE level; and
the second reference voltage set comprises a second upper reference level voltage equaling a sum of the second reference voltage level and the second DFE level, and a second lower reference voltage equaling the second reference voltage level minus the second DFE level.

7. The memory system of claim 6, wherein the first data line driver circuit comprises: a first sampler configured to determine the first bit values by comparing one of the first upper reference voltage and the first lower reference voltage with the input data received through the first data line, and
the second data line driver circuit comprises a second sampler configured to determine the second bit values by one of the second upper reference voltage and the second lower reference voltage with the input data received through the second data line.

8. The memory system of claim 7, wherein the input data received through the first data line is first input data and the input data received through the second data line is second input data, and the first sampler is further configured to:
when a first previous bit value of the first bit values is a first logical value, determine a first current bit value of the first bit values by comparing the first upper reference voltage with the first input data; and
when a previous bit value of the first input data is a second logical value different from the first logical value, compare the first lower reference voltage with the first input data to determine a current bit value of the first input data, and
the second sampler is further configured to:
when a previous bit value of the second input data is the first logical value, compare the second upper reference voltage with the second input data to determine a current bit value of the second input data; and
when a previous bit value of the second input data is the second logical value different from the first logical value, compare the second lower reference voltage with the second input data to determine a current bit value of the second input data.

9. The memory system of claim 1, wherein the first data line driver circuit includes a first reference voltage generator configured to the first reference voltage set including a first upper reference voltage and a first lower reference voltage that are concurrently output,
wherein the first reference voltage generator includes:
an adder circuit configured to add the first code and the second code to generate a first sub-code for the first upper reference voltage;
a first decoder circuit configured to decode the first sub-code;
an upper reference voltage selector circuit configured to output the first upper reference voltage, based on the decoding result of the first decoder circuit;
a subtractor circuit that performs a subtraction operation on the first code and the second code to generate a second sub-code for the first lower reference voltage;
a second decoder circuit configured to decode the second sub-code; and
a lower reference voltage selector circuit configured to output the first lower reference voltage, based on the decoding result of the second decoder.

10. The memory system of claim 1, wherein the first data line driver circuit comprises:
a first reference voltage generator configured to generate a first reference voltage based on the first code;
a first DFE generator configured to generate a first DFE positive voltage and a first DFE negative voltage based on the second code; and
a first sampler configured to determine the bit values of the first input data received through the first data line based on the first reference voltage, the first DFE positive voltage, and the first DFE negative voltage,
the second data line driver circuit comprises:
a second reference voltage generator configured to generate a second reference voltage based on the third code;
a second DFE generator configured to generate a second DFE positive voltage and a second DFE negative voltage based on the fourth code; and
a second sampler configured to determine the bit values of the second input data received through the second data line based on the second reference voltage, the second DFE positive voltage, and the second DFE negative voltage.

11. The memory system of claim 10, wherein the first sampler comprises:
a first sub-sampler configured to determine a first current bit value of the first input data using the first reference voltage and the first positive DFE voltage;
a second sub-sampler configured to determine a second current bit value of the first input data using the first reference voltage and the first negative DFE voltage; and
a multiplexer configured to select one of the first current bit value and the second current value based on a selection signal,
the selection signal is based on a previous bit value of the first input data.

12. The memory system of claim 1, wherein the memory device is a dynamic random access memory (DRAM) device, and
the memory device and the memory controller communicate with each other based on based on a graphic double data rate (GDDR) interface.

13. A memory system comprising:
a memory device; and
a memory controller configured to transmit first input data to the memory device through a first data line and a second data line,
wherein the memory device comprises:
a first data line driver circuit configured to determine bit values of the first input data received through the first data line based on a first reference voltage set; and
a second data line driver circuit configured to determine bit values of the first input data received through the second data line based on a second reference voltage set,
wherein the first reference voltage set includes a first upper reference voltage and a first lower reference voltage, and wherein the second reference voltage set includes a second upper reference voltage different from the first upper reference voltage and a second lower reference voltage different from the first lower reference voltage.

14. The memory system of claim 13, wherein the memory controller is further configured to store first to fourth codes by performing a training operation.

15. The memory system of claim 14, wherein the first code includes information of a first reference voltage level associated with the first data line,
the second code includes information of a first decision feedback equalization (DFE) level associated with the first data line,
the third code includes information of a second reference voltage level associated with the second data line, and
the fourth code includes information of a second DFE level associated with the second data line.

16. The memory system of claim 15, wherein the first data line driver circuit is further configured to generate the first reference voltage set based on the first code and the second code, and
the second data line driver circuit is further configured to generate the second reference voltage set based on the third code and the fourth code.

17. The memory system of claim 15, wherein the memory device further comprises a storage circuit configured to store the first to fourth codes.

18. The memory system of claim 17, wherein the storage circuit comprises:
a MR6 mode register configured to store the first code and the third code; and
a MR9 mode register configured to store the second code and the fourth code.

19. A memory system comprising:
a memory device; and
a memory controller configured to store first to fourth codes in the memory device by performing a training operation, the first code including information of a first reference voltage level associated with a first data line, the second code including information of a first decision feedback equalization (DFE) level associated with the first data line, the third code including information of a second reference voltage level associated with a second data line, and the fourth code including information of a second DFE level associated with the second data line;
wherein the memory device comprises:
a first data line driver circuit configured to generate a first upper reference voltage and a first lower reference voltage based on the first code and the second code; and
a second data line driver circuit configured to generate a second upper reference voltage and a second lower reference voltage based on the third code and the fourth code.

20. The memory system of claim 19, wherein the memory controller is further configured to transmit input data to the memory device through the first data line and the second data line,
the first data line driver circuit is further configured to determine first bit values of the input data received through the first data line based on the first upper reference voltage and the first lower reference voltage, and
the second data line driver circuit is further configured to determine second bit values of the input data received through the second data line based on the second upper reference voltage and the second lower reference voltage.

* * * * *